United States Patent
Liu et al.

(10) Patent No.: US 9,608,602 B2
(45) Date of Patent: Mar. 28, 2017

(54) UNCERTAINTY AWARE INTERCONNECT DESIGN TO IMPROVE CIRCUIT PERFORMANCE AND/OR YIELD

(71) Applicant: QUALCOMM Incorporated, San Diego, CA (US)

(72) Inventors: Chunchen Liu, San Diego, CA (US); Oscar Ming Kin Law, San Diego, CA (US); Ju-Yi Lu, Tainan (TW); Po-Hung Chen, San Diego, CA (US); Zhengyu Duan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/707,859

(22) Filed: May 8, 2015

(65) Prior Publication Data

US 2016/0329882 A1    Nov. 10, 2016

(51) Int. Cl.
*H03L 7/00* (2006.01)
*H03K 3/03* (2006.01)
(Continued)

(52) U.S. Cl.
CPC ..... *H03K 3/0315* (2013.01); *G01R 31/31937* (2013.01); *G06F 17/5045* (2013.01);
(Continued)

(58) Field of Classification Search
CPC ....... H01L 2224/48091; H01L 2924/00; H01L 2924/1305; H01L 2924/00014;
(Continued)

(56) References Cited

U.S. PATENT DOCUMENTS 6,333,680 B1    12/2001  Smith et al.
6,785,626 B2    8/2004   Corr
(Continued)

OTHER PUBLICATIONS

Caignet F., et al., "The Challenge of Signal Integrity in Deep-Submicrometer CMOS Technology", Proceedings of the IEEE, New York, US, vol. 89, No. 4, Apr. 1, 2001 (Apr. 1, 2001), pp. 556-573, XP011044494, ISSN: 0018-9219, p. 561, left-hand column, paragraph 6, p. 568, left-hand column, paragraph 3, figure 19.
(Continued)

*Primary Examiner* — Arnold Kinkead
(74) *Attorney, Agent, or Firm* — Loza & Loza, LLP

(57) ABSTRACT

Methods and an apparatus related to generating parameters and guidelines used in the manufacture of semiconductor IC devices are described. A method includes measuring a first oscillating signal produced by a first ring oscillator that includes a first interconnect provided in a first interconnect layer of an IC, selecting a first mode of operation for a second ring oscillator circuit that includes a second interconnect disposed in alignment with the first interconnect, selecting a second mode of operation for the second ring oscillator circuit, and determining one or more characteristics of the first interconnect based on a difference in frequency of the first oscillating signal produced when the second ring oscillator circuit is operated in the first mode and frequency of the first oscillating signal when the second ring oscillator circuit is operated in the second mode.

27 Claims, 15 Drawing Sheets

(51) Int. Cl.
*H03K 3/012* (2006.01)
*H01L 27/118* (2006.01)
*G06F 17/50* (2006.01)
*H01L 27/02* (2006.01)
*G01R 31/3193* (2006.01)
*H03K 19/003* (2006.01)

(52) U.S. Cl.
CPC ...... *G06F 17/5068* (2013.01); *G06F 17/5081* (2013.01); *H01L 27/0207* (2013.01); *H01L 27/11807* (2013.01); *H03K 3/012* (2013.01); *H03K 19/00346* (2013.01)

(58) Field of Classification Search
CPC ... H01L 2924/0002; H01L 2924/13091; H01L 27/11807; H03K 3/0315; H03K 3/0322; H03K 3/03; H03K 3/86; H03K 5/133; H03K 2005/00039; H03K 2005/00136; H03B 27/00; H03B 5/1888; H03L 7/00; H03L 7/0995; H03L 7/0891; H03L 7/18; H03L 2207/06; H03L 7/0805; H03L 7/093; G06F 17/5081; G06F 17/5045; G06F 17/5068
USPC ......... 331/2, 46, 57; 257/204; 324/649, 667, 324/679, 681; 327/543
See application file for complete search history.

(56) References Cited

U.S. PATENT DOCUMENTS

| | | |
|---|---|---|
| 6,785,627 B2 | 8/2004 | Corr |
| 7,109,738 B2 | 9/2006 | Savithri |
| 7,542,327 B2 | 6/2009 | Zimmermann |
| 7,958,471 B2 | 6/2011 | Fazekas et al. |
| 8,890,545 B2 | 11/2014 | Jamal et al. |
| 2010/0042960 A1 | 2/2010 | Fazekas et al. |
| 2015/0162923 A1* | 6/2015 | Jou ............... H03K 3/0322 331/48 |

OTHER PUBLICATIONS

Gag M., et al., "Temperature and On-chip Crosstalk Measurement using Ring Oscillators in FPGA", IEEE 15th International Symposium on Design and Diagnostics of Electronic Circuits & Systems (DDECS), Apr. 18, 2012 (Apr. 18, 2012), pp. 201-204, XP032187212, DOI: 10.1109/DDECS.2012.6219057, ISBN: 978-1-4673-1187-8, p. 202, right-hand column, paragraph 5, table I, p. 203, left-hand column, paragraph 1, figure 2.
International Search Report and Written Opinion—PCT/US2016/027627—ISA/EPO—Jun. 29, 2016.

* cited by examiner

UNCERTAINTY AWARE INTERCONNECT DESIGN TO IMPROVE CIRCUIT PERFORMANCE AND/OR YIELD

TECHNICAL FIELD

The present disclosure relates generally to Integrated Circuit Design, and in particular to interconnect designs used in integrated circuits.

BACKGROUND

The dimensions of integrated circuit (IC) technology used for very large scale integration (VLSI) applications continues to be scaled-down. Circuit dimensions in the nanometer realm (sub-100 nm) and below increase the significance of interconnect delays and other signaling characteristics in such VLSI applications. For example, decreased conductor width causes increased interconnect resistance, and decreased conductor spacing causes an increase in interconnect capacitance. Three-dimensional effects, including fringing and interline coupling, increase as the ratio of conductor height to conductor width increases. Furthermore, scaled-down ICs may operate at higher frequencies.

Reduced IC dimensions can result in parasitic effects related to an interconnect becoming greater than the parasitic effects attributable to logic gates driving the interconnect, or greater than the parasitic effects attributable to logic gates driven by the interconnect. Gate delay may be improved while interconnect delays between gates are not improved, or are degraded.

As VLSI technology evolves, increased device densities provide greater capabilities in IC devices, and more devices and/or functionality may be provided on an IC device. Increased functionality may result in drastic increases in the number of transistors and interconnects, and may increase the average length of the interconnects in order to connect the circuit elements. Chip area is often limited by the area physically occupied by interconnects, and designers are motivated to scale-down the dimensions of the interconnects and increase the number of metal layers. These factors can lead to increased interconnect density.

Technology downscaling has produced decreased delays attributable to a transistor or logic gate (which may be referred to as "intrinsic delay"), which may be measured in the picosecond range for example. Technology down-scaling has not decreased delays attributable to interconnects (which may be referred to as "extrinsic delay") at the same rate as transistor or logic gate with process evolution, due in part to reduced wire geometries that lead to increased resistance, capacitance of the interconnect and/or larger parasitic delays. As a result, interconnect delay has become a larger fraction of overall delay.

Uncertainty-aware interconnect Design for Manufacturability (DFM) guidelines are provided by foundries that manufacture VLSI devices using nanotechnology. Uncertainty-aware interconnect DFM plays an important role in the success of businesses. DFM can affect circuit performance as well impacting yield, cost and time-to-market. However, the limited DFM guidelines provided by foundries are often difficult for designers to apply in order to optimize the circuit layout with performance and area trade-off.

Accordingly, there exists a need for improvements in IC design processes.

SUMMARY

Certain aspects of the disclosure relate to systems, apparatus, methods and techniques for generating parameters and guidelines used in the manufacture of semiconductor IC devices.

In various aspects of the disclosure, a method, a computer program product, and an apparatus are provided. An apparatus may include a first ring oscillator circuit comprising a first delay stage that includes inverting logic elements coupled by a first interconnect of a first interconnect layer in an IC, a second ring oscillator circuit comprising a second delay stage that includes inverting logic elements coupled by a second interconnect in the IC. The second interconnect may be disposed in proximate alignment with the first interconnect. The first ring oscillator circuit may produce a first oscillating signal when enabled, where the first oscillating signal has a frequency indicative of one or more characteristics of the first interconnect. A current provided in the second interconnect may modify the one or more characteristics of the first interconnect.

In various aspects of the disclosure, a method includes monitoring a frequency of a first oscillating signal produced by a first ring oscillator, the first ring oscillator having a first delay stage that includes inverting logic elements coupled by a first interconnect of a first interconnect layer in an IC, selecting a first mode of operation for a second ring oscillator circuit that has a second delay stage which includes inverting logic elements coupled by a second interconnect in the IC, selecting a second mode of operation for the second ring oscillator circuit, and determining one or more characteristics of the first interconnect based on a difference in frequency of the first oscillating signal when the second ring oscillator circuit is operated in the first mode and frequency of the first oscillating signal when the second ring oscillator circuit is operated in the second mode. The second interconnect may be disposed in proximate alignment with the first interconnect. A current flowing in the second interconnect may modify the one or more characteristics of the first interconnect.

In various aspects of the disclosure, an apparatus includes a plurality of ring oscillators, including a victim ring oscillator that has a plurality of delay stages, each stage including inverting logic elements coupled by an interconnect in a victim interconnect layer in an IC. The apparatus may have a plurality of aggressor circuits, including one or more aggressor ring oscillators. Each aggressor ring oscillator may have a plurality of delay stages, where each stage includes inverting logic elements coupled by an aggressor interconnect in the IC. Each aggressor interconnect may be disposed in proximate alignment with a corresponding victim interconnect such that a current flowing in the aggressor interconnect modifies one or more characteristics of the corresponding victim interconnect. The apparatus may include mode selection logic that configures a mode of operation of the one or more aggressor ring oscillators. The apparatus may include a processing circuit configured to control the mode selection logic to configure different modes of operation for the one or more aggressor ring oscillators and to measure a frequency of a signal produced by the victim ring oscillator when the one or more aggressor ring oscillators is operated in each of the different modes of operation. One or more one or more parameters corresponding to a manufacturing process used to produce the IC are calculable based on differences in frequency of the first oscillating signal measured when the plurality of aggressor ring oscillators is operated in different modes of operation.

In various aspects of the disclosure, a processor-readable storage medium has instructions stored thereon. The storage medium may be transitory or non-transitory. The instructions may be executable by a processor in a processing circuit. In some examples, the instructions may cause the processor to monitor a frequency of a first oscillating signal produced by a first ring oscillator, where the first ring oscillator has a first delay stage that includes inverting logic elements coupled by a first interconnect of a first interconnect layer in an IC, select a first mode of operation for a second ring oscillator circuit that comprises a second delay stage that includes inverting logic elements coupled by a second interconnect in the IC, select a second mode of operation for the second ring oscillator circuit, and determine the one or more characteristics of the first interconnect based on a difference in frequency of the first oscillating signal when the second ring oscillator circuit is operated in the first mode and frequency of the first oscillating signal when the second ring oscillator circuit is operated in the second mode. The second interconnect may be disposed in proximate alignment with the first interconnect. A current flowing in the second interconnect may modify one or more characteristics of the first interconnect.

DETAILED DESCRIPTION

Figure 1:
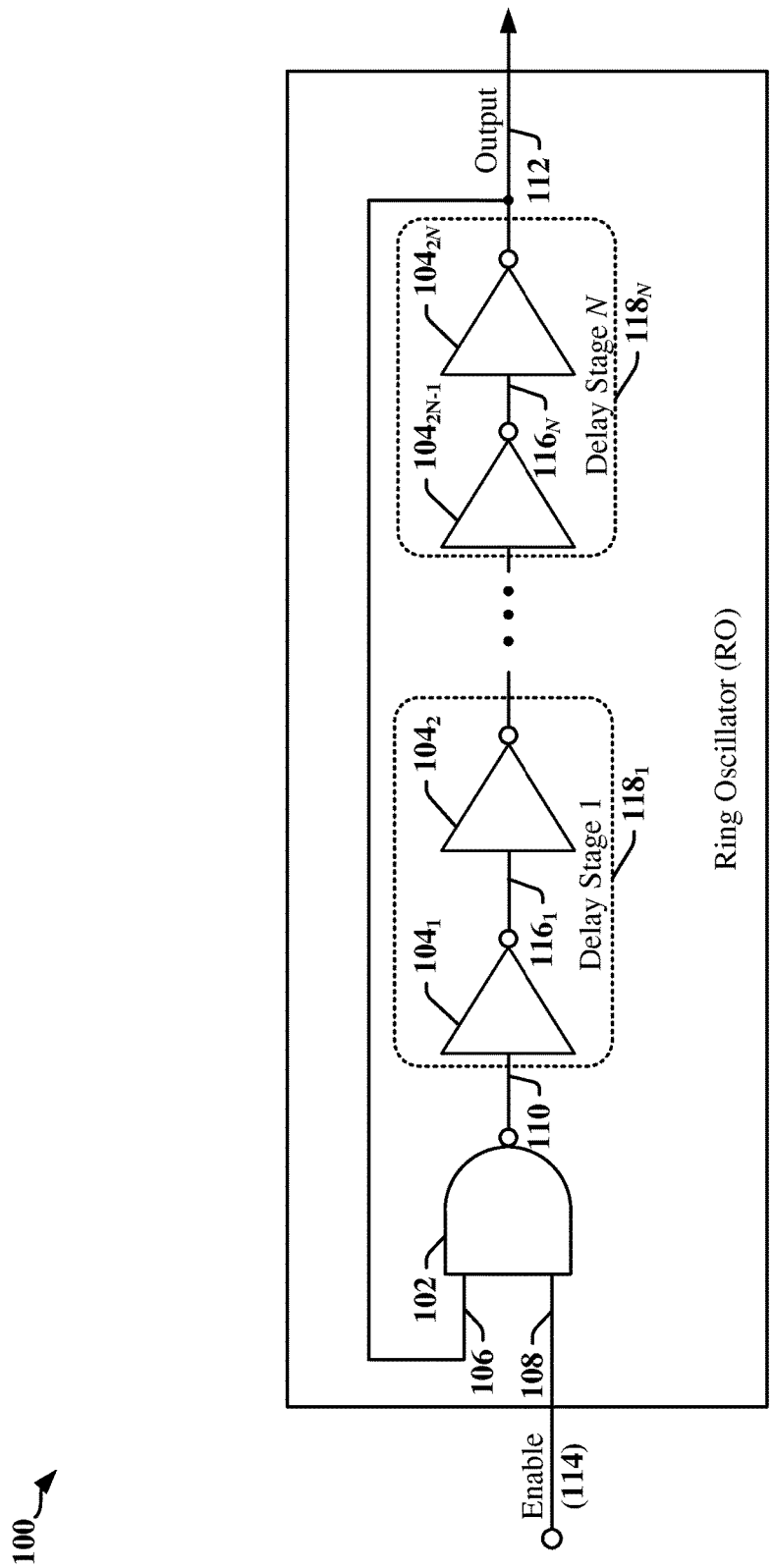
FIG. 1 illustrates a ring oscillator that may be adapted according to certain aspects disclosed herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of IC design, including VLSI semiconductor IC design, will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

Overview

Certain aspects of the invention relate to the application of DFM guidelines for different layouts, and related electrical impacts as well as the area and performance tradeoff. Conventional current extraction and simulation models may not be able to account for all process variations in complex circuit layouts associated with nanotechnology applications. Popular circuit layouts are addressed to illustrate the DFM trade-off, including the digital standard cell and the analog differential pair as well as the passive elements.

In one example, the compact digital standard cell requires a minimum channel length to attain performance, power and area requirements. On the other hand, area is not the most critical design criteria for analog circuit designs, which may focus on accurate circuit performance at various frequencies as well as the noise immunity capability. Moreover, the circuit designer may prefer quantifying those guideline electrical impacts with performance, power and area tradeoff.

Restricted Design Rules (RDR) according to certain aspects disclosed herein can restrict layout topology in order to limit the high order effect impacts and simplify electronic design automation (EDA) tool implementation. Additional DFM guidelines may be employed to further enhance the device performance with yield improvement. According to certain aspects disclosed herein, ring oscillator (RO) circuits may be used to measure gate delays and certain characteristics of interconnects in IC devices.

The Ring Oscillator

FIG. 1 is a block schematic diagram that illustrates an example of a ring oscillator 100 according to one aspect. The ring oscillator 100 includes a NAND gate 102 and N delay stages $118_1$-$118_N$. Each delay stage $118_1$-$118_N$ includes an interconnect $116_1$-$116_N$ that couples inverting logic, which may include NAND, NOR, inverter and/or other such logic. In the illustrated example, the inverting logic is represented as inverters $104_1$-$104_{2N}$ in order to simplify description of certain aspects disclosed herein. The ring oscillator includes an even number (2N) of the inverters $104_1$-$104_{2N}$. The NAND gate 102 has at least two input terminals 106, 108 and an output terminal 110. The NAND gate 102 provides an output terminal 110 that may be input into the first inverter 104a. The inverters 104a, 104b, 104n are connected in series. The 2Nth inverter $104_{2N}$ (i.e., the last driver in the Nth stage $118_N$) drives the output 112 of the ring oscillator 100, and this output 112 is provided as a feedback signal to an input terminal 106 of the NAND gate 102. Another input terminal 108 receives an enable signal 114 that enables operation of the ring oscillator 100. In one example, the enable signal 114 may be controlled by a processing circuit such as the processing circuit 602 shown in FIG. 6 or the processing circuit 1202 shown in FIG. 12. The ring oscillator 100 has an odd number of inversion stages (2N inverters $104_1$-$104_{2N}$, and the NAND gate 102), and when the ring oscillator 100 is sufficiently powered and the enable signal 114 is set to a logic high state, a feedback loop results and the ring oscillator output 112 toggles between logic high and logic low states.

The ring oscillator 100 may be adapted in accordance with certain aspects disclosed herein to permit measurements of gate delays and determination or calculation of certain characteristics of the interconnects $116_1$-$116_N$, which may then be related to process and/or operational parameters of a semiconductor IC device, for example. The frequency of oscillation of the ring oscillator 100 is representative of the sum of the delays attributable to the operation of the logic elements 102, $104_1$-$104_{2N}$ in the feedback loop of the ring oscillator 100, and the delays associated with the interconnects between the logic elements 102, $104_1$-$104_{2N}$ in the feedback loop. Accordingly, a variation in frequency of oscillation of the ring oscillator 100 may be indicative of a change or difference in one or more delays, and a changed characteristic of the ring oscillator 100 may be calculated based on such differences.

Restricted Design Rules

Certain aspects disclosed herein relate to the application of DFM guidelines for different layouts, and to related electrical impacts as well as area and performance tradeoffs. In one example, a compact digital standard cell requires minimum channel length to attain performance, power and area requirements and, in another example, area is not such a critical design criteria for analog circuit designs that may focus on accurate circuit performance at various frequencies as well as the noise immunity capability. In some instances, circuit designers may prefer quantifying guideline electrical impacts with performance, power and area tradeoff.

Restricted Design Rules (RDR) according to certain aspects disclosed herein can restrict layout topology in order to limit the high order effect impacts and simplify electronic design automation (EDA) tool implementation. Additional DFM guidelines may be employed to further enhance the device performance with yield improvement. According to certain aspects disclosed herein, design parameters associated with interconnects may be calculated using measurements of characteristics and values obtained through the use of ring oscillator circuits deployed in IC devices.

In nanotechnology applications, Silicon-to-Simulation (S2S) correlation may be affected to a greater extent by effects of geometry and process than conventional systems. For example, the effects of interconnect coupling are not limited to intra-layer coupling in nanotechnology applications, but also to inter-layer coupling when metal layers are separated by thin insulator layers. Such inter-layer coupling is difficult to measure using conventional interconnect structures. The effect of variations in metal density may also give rise to S2S correlation issues in nanotechnology applications. These variations in metal density may result from a hybrid chemical and mechanical planarization (CMP) process used to polish and smooth metal layers in nanotechnology applications. The combined etching and abrading of CMP may result in a combination of dishing and erosion effects that can be highly correlated with copper density. Metal density can rapidly transition from low density to high density and from high density to low density, which may result in a "metal cliff" between layers and can cause large variations in parasitic resistance-capacitance (RC) time constants for interconnects.

Evaluating Interconnect Designs

Figure 2:
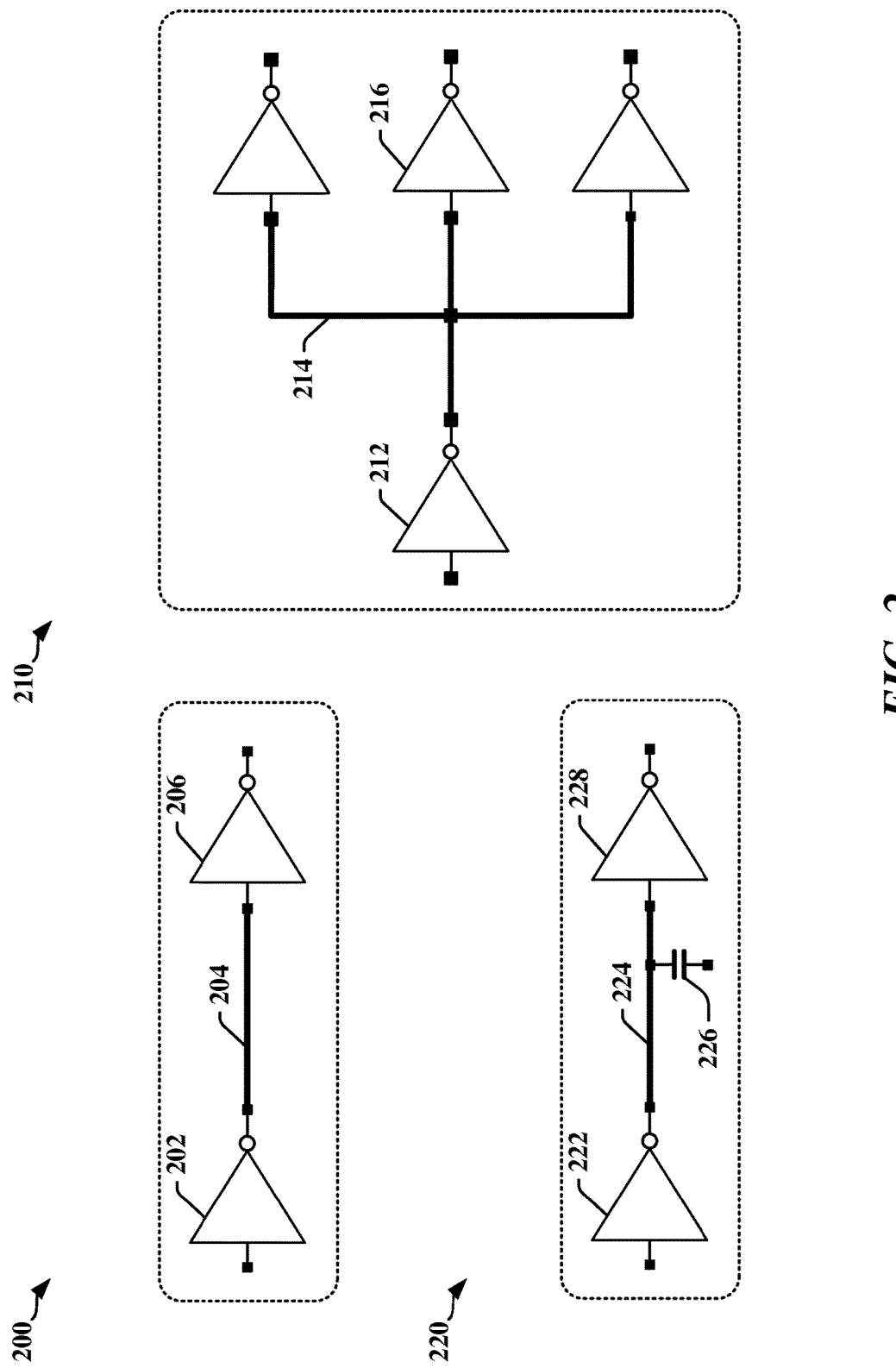
FIG. 2 illustrates a first example of adapted stages of a ring oscillator that may be used to measure certain process variations and to calculate parameters associated with an IC design in accordance with certain aspects disclosed herein.

FIG. 2 provides examples of delay stages 200, 210 and 220 of a ring oscillator that may be employed to measure certain routing process variations and to calculate parasitic resistance and capacitance values under different process conditions. For example, the ring oscillator 100 illustrated in FIG. 1 may be adapted to include one or more of the delay stages 200, 210, 220 to enable calculation of interconnect resistance and capacitance using measurements of frequency (f) of the output 112 of the ring oscillator 100. The resistance and capacitance of the circuit delay stages 200, 210, 220 can be calculated from the frequency of the signal at the ring oscillator output 112, leakage current Iddq, and switching current Idda. A delay D, capacitance $C_S$, and switching resistance $C_{SW}$ of delay stages 200, 210, 220 can be derived from:

$$D = \frac{4nm}{f} \quad \text{Eq. [1a]}$$

$$C_S = \frac{2D(Idda - Iddq)}{Vdd} \quad \text{Eq. [1b]}$$

$$D = R_{SW}C_S \Rightarrow R_{SW} = \frac{Vdd}{2D(Idda - Iddq)} \quad \text{Eq. [1c]}$$

These equations may be resolved using a combination of ring oscillators with different configurations and/or components. In one example, the capacitance of a CMOS gate can be measured using a set of 3 ring oscillators adapted to include the delay stages 200, 210, 220. Each of these delay stages 200, 210, 220 includes logic gates (here, inverters) 202, 206, 212, 216, 222, 228, and at least one interconnect 204, 214, 224. The stages of one ring oscillator may be constructed as a reference ring oscillator using the first stage 200 that includes reference inverters 202, 206. The stages of another ring oscillator may be constructed using a second delay stage 210 that includes inverters 212, 216 that have a fanout of 3; that is, the inverters 212, 216 may each drive three other logic gates. The stages of another ring oscillator may be constructed using the third delay stage 220, which includes a local capacitor 226. Equations Eq[2a], Eq[2b], and Eq[2c] may be used to express delay of ring oscillator for fanout FO=1, fanout FO=3, and with a local capacitor $C_L$, respectively. Switching resistance may be considered identical because the inverters are identical in each RO, enabling the input capacitance $C_{in}$, output capacitance $C_{out}$, and loaded capacitance $C_L$ to be calculated:

$$D1 = R_{sw}(C_{in} + C_{out}) \quad \text{Eq. [2a]}$$

$$D2 = R_{sw}(3C_{in} + C_{out}) \quad \text{Eq. [2b]}$$

$$D3 = R_{sw}(C_{in} + C_{out} + C_L) \quad \text{Eq. [2c]}$$

Various characteristics, process variables and other parameters associated with interconnect designs may be measured, calculated and/or evaluated using ring oscillators adapted in accordance with certain aspects disclosed herein.

Figure 3:
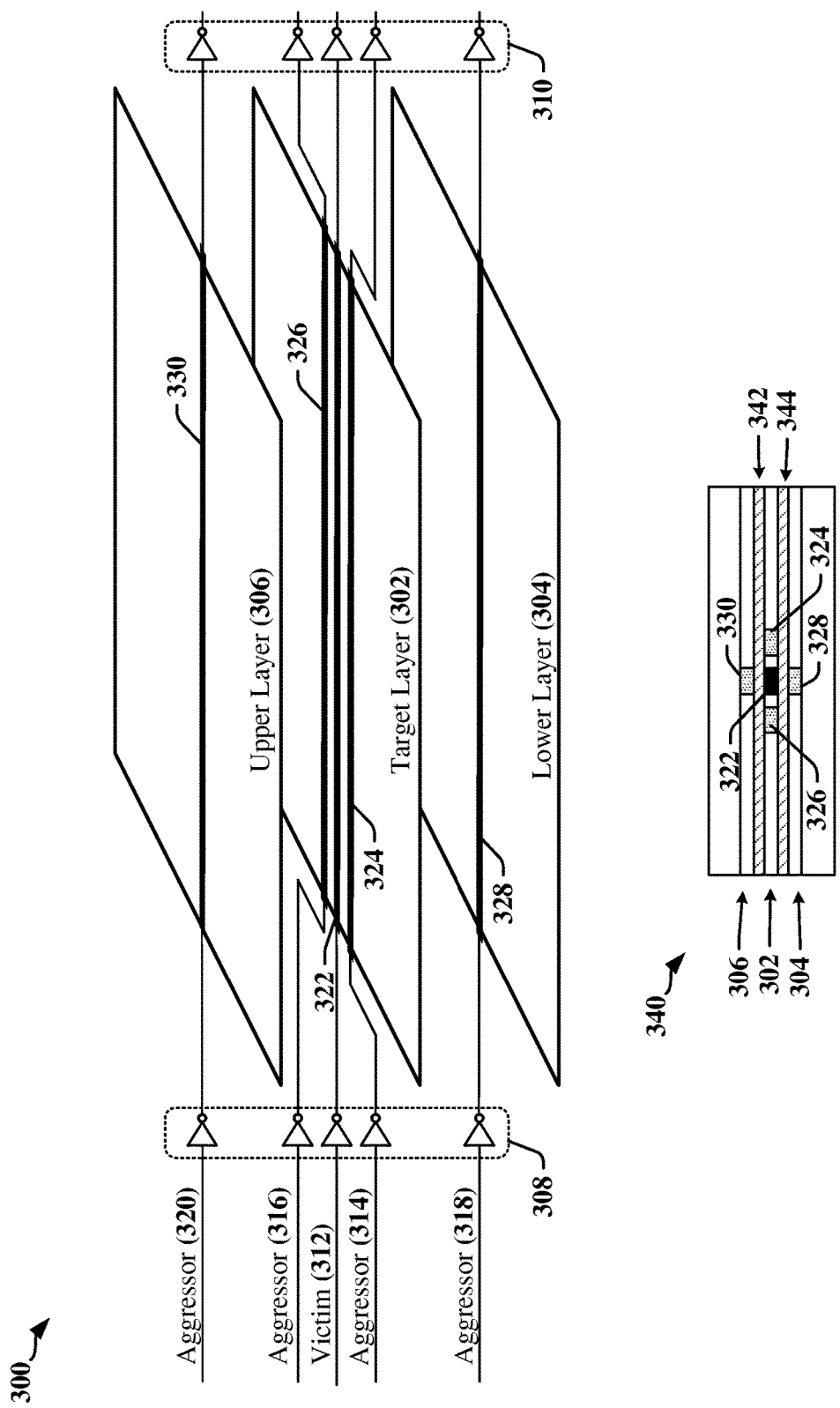
FIG. 3 illustrates an example of a test cell that may be employed to examine the effects of nearby interconnects and circuits on an interconnect design in accordance with certain aspects disclosed herein.

FIG. 3 is a simplified representation of a test cell 300 that may be employed to measure, calculate, or otherwise determine certain characteristics, process variables and other parameters associated with interconnect designs. The test cell may include a plurality of inverters 308, 310 connected by one or more interconnects 322, 324, 326, 328, 330. The test cell 300 may include interconnects 322, 324, 326 that are provided on at least one interconnect layer of an IC, which may be referred to as the target layer 302 in FIG. 3. In certain implementations, the test cell 300 may be three-dimensional (3D) in nature, and may include an upper layer 306 physically disposed over the target layer 302, and/or a lower layer 304 physically disposed under the target layer 302. In this disclosure, the depictions and descriptions of the orientation and disposition of the layers 302, 304, 306 relate to a single example, and the test cell 300 may be provided in any desired location and/or orientation on an IC device.

The test cell 300 may be used to determine or measure certain parameters based on the operation of a victim circuit 312 within a ring oscillator 100 (see FIG. 1). The victim circuit may transmit an oscillating signal through a victim interconnect 322 on the target layer 302 such that the frequency of oscillation is affected by the characteristics of the victim interconnect 322. The test cell 300 may be one of N similarly configured cells that operate as the delay stages $118_1$-$118_N$ of the ring oscillator 100 in FIG. 1.

There may be one or more additional interconnects 324, 326 disposed on the target layer 302 and arranged in physical proximity adjacent to the victim interconnect 322. These additional interconnects 324, 326 may be put to various uses. In one example, one or more interconnects 324, and/or 326 may operate to shield the victim interconnect 322 from extraneous noise, signals or other effects attributable to electromagnetic and/or capacitive coupling with other nearby aggressor interconnects 324, 326. In this example, an interconnect 324, and/or 326 may carry a DC current or no current. In another example, one or more interconnects 324, and/or 326 may carry an oscillating aggressor signal that may be electromagnetically or capacitively coupled to the victim interconnect 322 in manner that may affect the characteristics of the victim interconnect 322 and/or a signal carried by the victim interconnect 322. The oscillating aggressor signal may be selected from one or more phase versions of the signal produced by the victim circuit 312, an oscillating signal associated with an aggressor circuit 314, 316, and a fixed-state input signal (e.g., corresponding to a logic "0" or logic "1" input to an aggressor circuit 314, 316).

The test cell 300 may include one or more additional interconnect layers 304, 306. As illustrated in the cross-sectional view 340, the target layer 302 is provided between a lower layer 304 and an upper layer 306. Insulating layers 342, 344 may be provided between adjacent layers 302, 304 and/or 306. The layers 302, 304 and/or 306 may be in substantial planar alignment with one another. One or more interconnects 328, 330 may be provided on the additional layers 304, 306. In the illustrated example, an interconnect 328, 330 is disposed on each of the lower layer 304 and/or the upper layer 306, and these interconnects 328, 330 may be aligned directly above or below the victim interconnect 322. In some instances, the interconnect 328, and/or 330 provided on the lower layer 304 and/or the upper layer 306 may be closely matched in dimension with the victim interconnect 322. In some instances the interconnect 328, and/or 330 provided on the lower layer 304 and/or the upper layer 306 may have a greater area than the victim interconnect 322. That is the interconnect 328, and/or 330 provided on the lower layer 304 and/or the upper layer 306 may have a greater width than the victim interconnect 322.

Interconnects 328, and/or 330 provided on the lower layer 304 and/or the upper layer 306 may be in close physical proximity to the victim interconnect 322, including when thin insulating layers are used to separate the layers 302, 304, and/or 306. The interconnects 328, and/or 330 provided on the lower layer 304 and/or the upper layer 306 may be used to shield the victim interconnect 322 from extraneous noise, signals or other effects attributable to electromagnetic and/or capacitive coupling with nearby aggressor interconnects 328, 330. In this example, the interconnects 328, 330 may carry a DC signal or no signal. The interconnects 328, and/or 330 provided on the lower layer 304 and/or the upper layer 306 may carry an oscillating aggressor signal that may be electromagnetically and/or capacitively coupled to the victim interconnect 322 in manner that may affect the characteristics of the victim interconnect 322 and/or a signal carried by the victim interconnect 322. The oscillating aggressor signal may be selected from one or more phase versions of the signal produced by the victim circuit 312, an oscillating signal associated with an aggressor circuit 318, 320, and a fixed-state input signal (e.g., corresponding to a logic "0" or logic "1" input to an aggressor circuit 318, 320).

According to certain aspects disclosed herein, a ring oscillator may be constructed with multiple delay stages. The delay stages may each include two inverting logic elements coupled by an interconnect. The delay stages may have interconnects provided in the same interconnect layer. In some instances, different delay stages of the ring oscillator may include interconnects provided in different interconnect layers. The delay stages may have a geometry or location within an IC device that enables power and delay measurements to be obtained. A first ring oscillator may be used as a victim circuit that is subject to effects associated with electromagnetic and/or capacitive coupling with one or more aggressor circuits. For example, one or more aggressor circuits may be provided in the same interconnect layers and/or one or more aggressor circuits may be provided in one or more parallel, adjacent interconnect layers. The aggressor circuits may include ring oscillators constructed in a similar fashion to the first ring oscillator. In some instances, an aggressor circuit may be implemented as a simple (or dummy) metal interconnection, which may optionally carry a current, and/or be configured or provide some degree of shielding.

Figure 4:
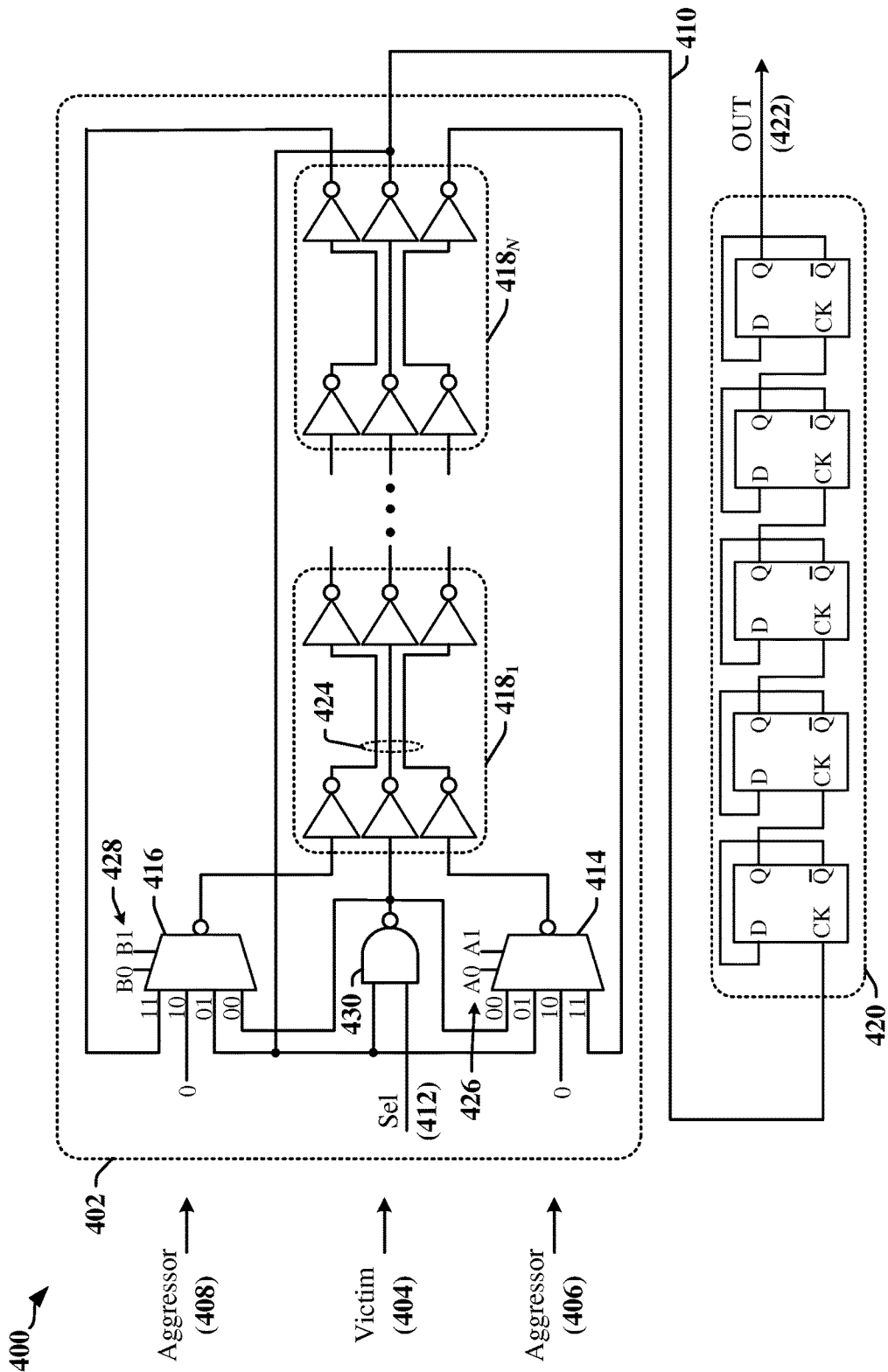
FIG. 4 illustrates an example of a multi-stage circuit that may be employed to examine the effects of nearby interconnects and circuits on an interconnect design in accordance with certain aspects disclosed herein.

FIG. 4 illustrates an example of a circuit 400 that may be employed to examine the effects of nearby interconnects and circuits on an interconnect design. The test circuit may include test stages 418a-418n constructed as illustrated by the test cell 300 of FIG. 3. A test circuit 402 may include a victim ring oscillator 404 that includes an interconnect 322 provided in proximity to interconnects 324, 326, 328, and/or 330 that are components or elements of one or more aggressor ring oscillators 406 and 408. It will be appreciated that, while two aggressor ring oscillators 406 and 408 are depicted, more than two aggressor ring oscillators may be employed. In some instances, two or more of the aggressor interconnects 324, 326, 328, and/or 330 may be part of the same ring oscillator. In some instances, two or more aggressor interconnects 324, 326, 328, and/or 330 in the same test cell 300 may be elements of different circuits that are driven by the same source signal.

The test circuit 402 includes one or more multiplexers 414, 416 that can be used to configure the mode of operation of a ring oscillator circuit. The multiplexer may be controlled by a processing circuit, or the like, to configure the operation of the aggressor ring oscillators 406, 408 such that a variety of measurements of frequency of the output signal 410 of the victim ring oscillator 404 may be obtained. In the example, a first multiplexer 414 configures a first aggressor ring oscillator 406 and a second multiplexer 416 multiplexers 414, 416 may be controlled by the same control signals, or may receive different control signals 426, 428.

In a first configuration (control signal 426, 428 state=00) a multiplexer 414, 416 may provide an inverted version of the output of the NAND gate 430 in the victim ring oscillator 404 as the input to the respective aggressor ring oscillator 406, and/or 408 delay elements, thereby producing a signal in the aggressor ring oscillator 406, and/or 408 that is 180 degrees out of phase with the signal in the victim ring oscillator 404.

In a second configuration (control signal 426, 428 state=01) a multiplexer 414, 416 may provide a same-phase (non-inverted) version of the output of the NAND gate 430 in the victim ring oscillator 404 as the input to the respective aggressor ring oscillator 406, and/or 408 delay elements, thereby producing a signal in the aggressor ring oscillator 406, and/or 408 that is in-phase with the signal in the victim ring oscillator 404.

In a third configuration (control signal 426, 428 state=10) a multiplexer 414, 416 may provide a fixed logic level as the input to the respective aggressor ring oscillator 406, and/or 408 delay elements, thereby producing a non-oscillating signal in the aggressor ring oscillator 406, and/or 408.

In a fourth configuration (control signal 426, 428 state=11) a multiplexer 414, 416 may serve as an inverter in the respective aggressor ring oscillator 406, and/or 408 delay elements, thereby producing a free-running signal in the aggressor ring oscillator 406, and/or 408 that have an indeterminate phase relationship with the signal in the victim ring oscillator 404.

The output signal 410 of the victim ring oscillator 404 may have a frequency that is measurable by instruments capable of multi-Gigahertz capability. In some instances, process and other parameters may be calculated with sufficient accuracy using a derivative of the output signal 410. The output signal 410 may be provided to a down counter, such as the 5-bit counter 420, which produces a lower frequency (scaled) output signal 422 that may be more easily measured. For example, an output signal 410 at 1 GHz and provided to the counter 420 is divided by 32 to produce a scaled output signal 422 at 31.25 MHz. The number of bits in the down counter may be selected and/or adapted based on operating frequency.

While a designer may manually configure and monitor the operation of the test circuit 402, in many implementations a processing circuit may be configured to operate the test circuit 402. In one example, the processing circuit may be used when a considerable number of instances of the test circuit 402 are provided on an IC. In this and other examples, additional circuits may be deployed to automate measurements of process variations in an IC design.

Examples of Circuits Used for Measuring Process Variations in an IC Design

Figure 5:
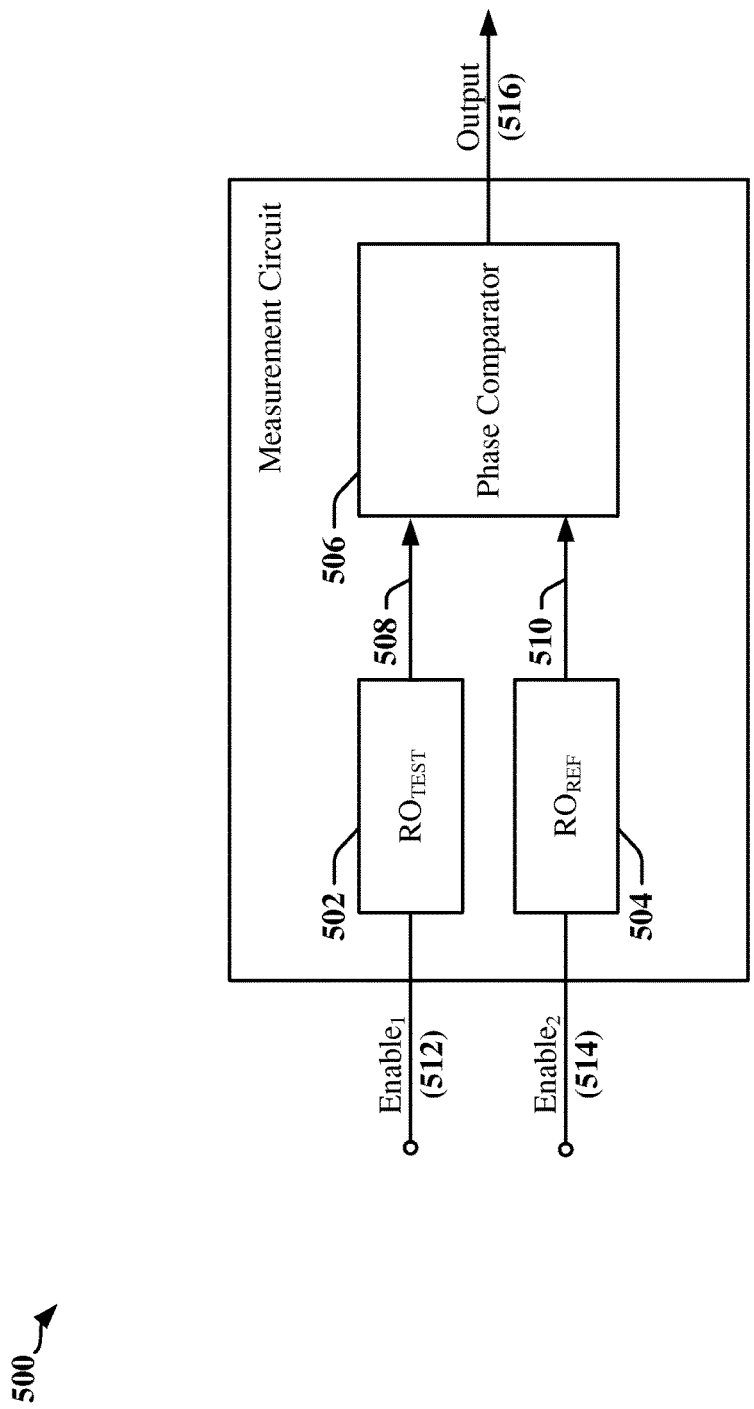
FIG. 5 illustrates an example of a circuit that can be adapted to measure gate delays and/or interconnect delays in accordance with certain aspects disclosed herein.

FIG. 5 is a block schematic diagram illustrating one example of a circuit 500 that can be used to measure gate delays and/or interconnect delays in accordance with certain aspects disclosed herein. The outputs 508, 510 of two ring oscillators 502, 504 are coupled to a phase comparator 506. The phase comparator 506 may be configured to determine a frequency difference $f_{diff}$ between the outputs 508, 510 produced by the ring oscillators 502, 504. The ring oscillators 502, 504 may be fabricated using the same process steps and may be collocated or located in structurally similar areas of an IC device. A first ring oscillator ($RO_{TEST}$) 502 may be subjected to a variance in constituent components, process, operation and/or structure that causes its output 508 to differ in frequency from the output of a second ring oscillator ($RO_{REF}$) 504. In one example, the two ring oscillators 502, 504 may have a different number of gates. In another example, a terminal of a logic gate or transistor under test may be coupled to a terminal of a logic element 102, 104a, 104b, . . . 104n in the feedback loop of the first ring oscillator 502. In another example, the length of one or more interconnects in the first ring oscillator 502 may be different from the length of the corresponding interconnects of the second ring oscillator 504. As disclosed herein, the circuit 500 may be adapted to measure other characteristics of an interconnect and/or device in an IC, including environmental conditions, external influences, and on-chip variation (OCV) effects including process, voltage and temperature (PVT) variation effects.

Figure 6:
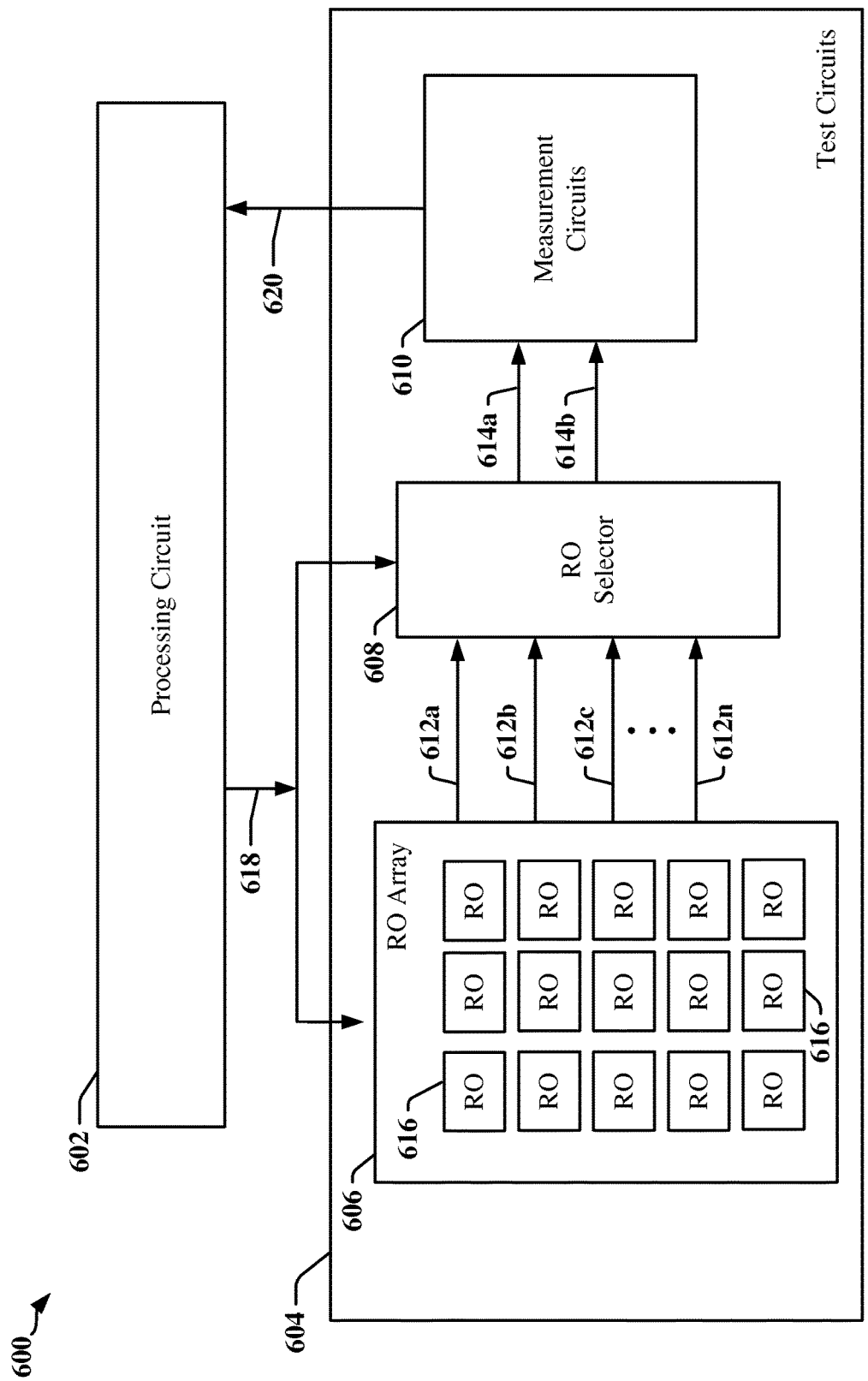
FIG. 6 is a diagram that illustrates a first example of a test circuit for measuring and monitoring characteristics of certain devices on an IC and their respective interconnects according to certain aspects disclosed herein.

FIG. 6 is a simplified block schematic diagram that illustrates a test platform apparatus 600 for measuring and monitoring characteristics of certain devices on an IC and their respective interconnects according to one aspect of the disclosure. The apparatus 600 may include a processing circuit 602, and one or more test circuits 604.

The test circuits 604 include one or more arrays of ring oscillators 606, one or more ring oscillator selector circuits 608, and measurement circuits 610. The processing circuit 602 may configure the test circuits 604 in order to perform any of a plurality of different types of tests, as disclosed herein. For each test configuration, the processing circuit 602 may provide control signals 618 that enable one or more ring oscillators 616 in the array of ring oscillators 606 such that the enabled ring oscillators 616 produce output signals 612a-612n that oscillate at frequencies determined by the characteristics and configurations of the respective enabled ring oscillators 616. The ring oscillator selectors 608 may be controlled to select output signals 612a-612n from the array of ring oscillators 606 as input signals 614a and 614b to the measurement circuits 610. The measurement circuits 610 may include circuits that can measure frequencies of the input signals 614a and 614b, and/or differences in frequencies, relative delays and/or phase differences between two or more input signals 614a and 614b. The input signals 614a and 614b may include one or more reference signals produced by designated ring oscillators 616 in the array of ring oscillators 606. In some instances, reference signals may be produced by a ring oscillator or clock generator that is not included in the array of ring oscillators 606.

The array of ring oscillators 606 includes a plurality of ring oscillators 616. The ring oscillators 616 may be grouped according to function, location and/or process used for producing the ring oscillators 616. The number, location, and operational relationships of the ring oscillators 616 in the array of ring oscillators 606 may vary according to application.

In one example, the ring oscillator selector circuit 608 selects two or more of the ring oscillator output signals 612a-612n produced by the array of ring oscillators 606 as inputs 614a, 614b to the measurement circuits 610. The ring oscillator output signals 612a-612n may include signals that represent the frequency of oscillation of corresponding enabled ring oscillators 616 in the array of ring oscillators 606. The ring oscillator selector circuit 608 may include one or more switches or multiplexers that select between the ring oscillator output signals 612a-612n. The measurement circuits 610 may be configured to analyze the frequencies in the signals 614a, 614b received from the ring oscillator selector circuit 608. The measurement circuits 610 may generate an output signal 620 representative of one or more measured quantities related to the measured signals 614a, 614b. In some instances, the measurement circuits 610 may include a simple comparator circuit that provides a binary output signal indicating which of the two input signal 624a, 624b has a greater frequency. In other instances, the measurement circuits 610 may be configured to perform more complex analyses on the frequencies of the two input signals 624a, 624b, and may generate an output signal 620 that communicates an array of information.

Figure 7:
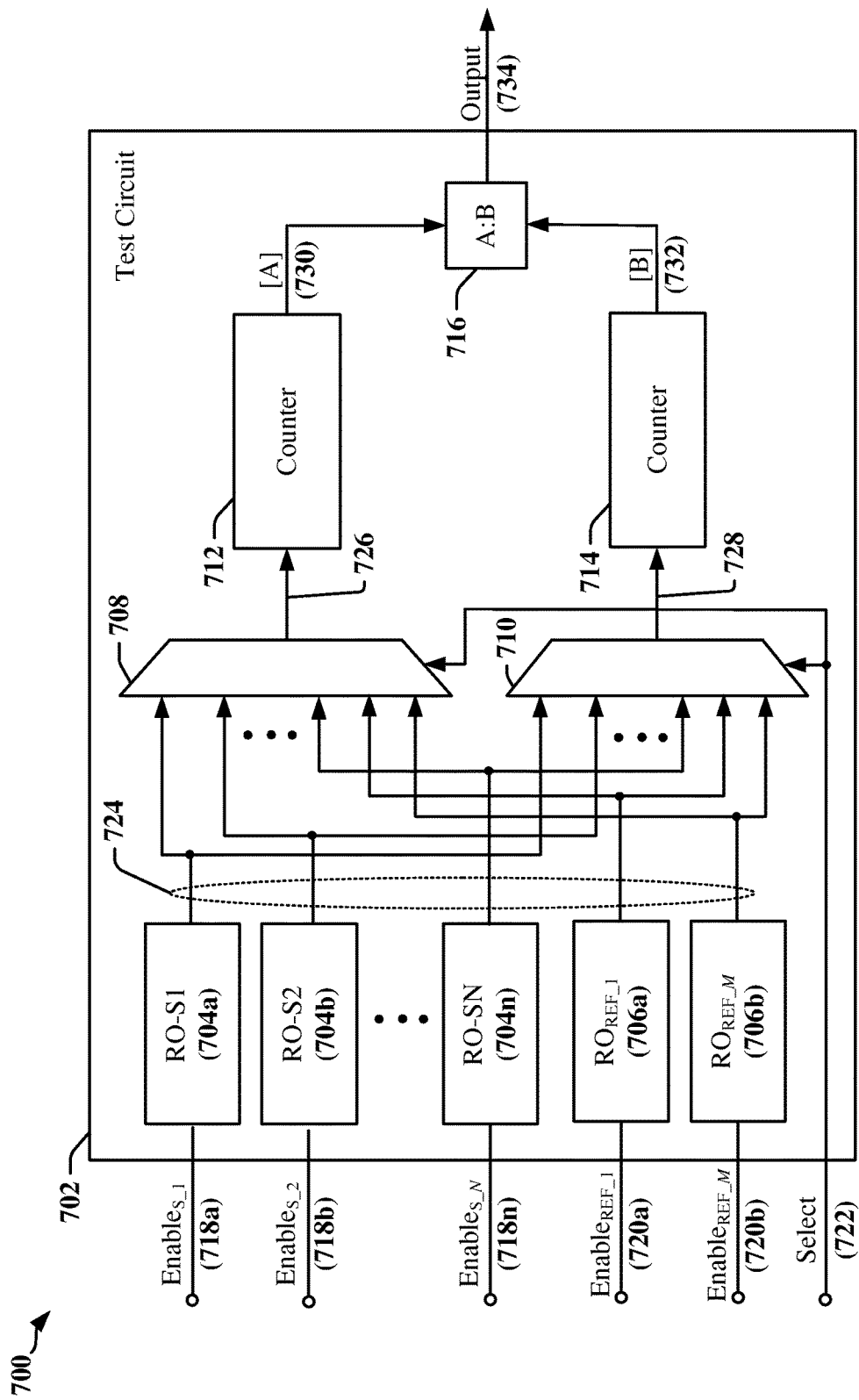
FIG. 7 illustrates a second example of a test circuit configured according to certain aspects disclosed herein.

FIG. 7 is a schematic block diagram illustrating a test circuit 700 configured according to certain aspects disclosed herein. The test circuit 700 includes a plurality of ring oscillators 704a-704n, 706a, 706b, a first switch 708, a second switch 710, a first counter 712, a second counter 714, and logic circuits 716 that may include comparison logic, and/or logic configured to perform addition, subtraction, multiplication, division, or other mathematical or logic functions.

In the illustrated example, a first group of ring oscillators 704a-704n may be configured to measure attributes or parameters associated with a logic gate, transistor and/or interconnect. A second group of ring oscillators 706a, 706b may provide reference signals and/or test signals, where the test signals may be generated to measure impacts on the attributes or parameters measured by the first group of ring oscillators 704a-704n. The ring oscillators 704a-704n, 706a, 706b may be enabled selectively, such that each ring oscillator 704a-704n, or 706a, 706b may be enabled and disabled at various times.

The ring oscillators 704a-704n, 706a, 706b may be placed at various locations within an IC. When two different ring oscillators 704a-704n are selected for analysis, the selected ring oscillators 704a-704n may be collocated or located in different parts of the IC. Different areas of the IC may experience different process variations on the die, different fluctuations in temperature, and/or different fluctuations in supply voltage, or different interferences. Thus, two ring oscillators 704a-704n that are physically further from one another may have a greater difference between their operational frequencies than two ring oscillators 704a-704n that are located in close physical proximity to one another. For example, two ring oscillators 704a-704n physically separated by at least 10 μm, 50 μm, 100 μm, 200 μm, 500 μm, or 1000 μm apart on the IC may be selected.

Additional Examples of Ring Oscillators Used for Layout Validation

As disclosed herein, ring oscillators may be adapted or configured to measure certain characteristics and/or to establish or adjust design parameters used for interconnect design. An interconnect ring oscillator may be provided in IC devices during chip development to monitor routing process variations and to calculate parasitic resistance and capacitance values under certain process conditions. The interconnect ring oscillators may also be used to determine crosstalk impacts. In some instances, interconnect ring oscillators may be embedded in the final device to support debugging of interconnect failure. Accordingly, a ring oscillator that is configured to measure parameters and characterize an interconnect layer may be adapted or used in conjunction with other circuits to obtain measurements of a broader range of process-related parameters.

Figure 8:
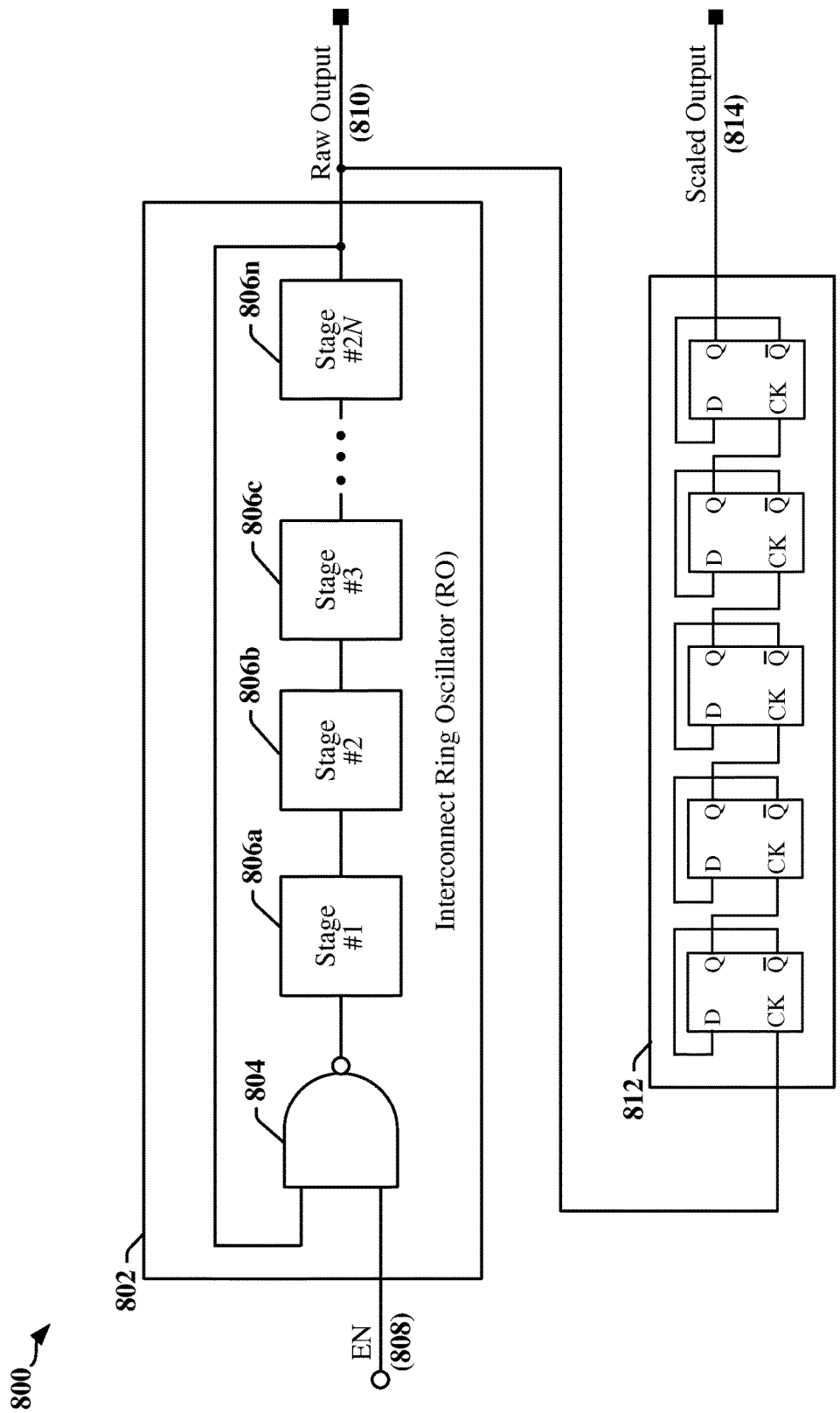
FIG. 8 illustrates the use of a ring oscillator for characterizing and/or monitoring interconnects according to certain aspects disclosed herein.

FIG. 8 is a simplified block schematic diagram that generalizes the structure of a ring oscillator 802. The ring oscillator 802 may be used for characterizing and/or monitoring interconnects and other characteristics. The ring oscillator 802 includes a NAND gate 804 and a plurality of delay stages 806a-806n. The NAND gate provides a means for controlling the operation of the ring oscillator 802 by gating the feedback of the raw output signal 810 based on the state of an enable signal 808, which may be provided by a processing circuit for example.

The number (2N) of delay stages 806a-806n may be selected according to application needs, process technology used and the parameter to be evaluated. One or more of the delay stages 806a-806n may be configured to target a specific parameter. In one example, the output of a gate in the delay stage 806a-806n may be coupled to a terminal of one or more other logic gates. In another example, ring oscillator 802 may include an elongated interconnect. The number of delay stages 806a-806n may include an even number of inverting logic gates such that the combination of the NAND gate 804 and delay stages 806a-806n provides a feedback loop with an odd number of signal state inversions.

The ring oscillator 802 produces a raw output signal 810 that may be further processed by a measurement circuit 610 (see FIG. 6, for example). The raw output signal 810 may be coupled to a pad that can be accessed by instruments that may be used to measure the frequency of the raw output signal 810, and/or differences between the frequency of the raw output signal 810 and the frequencies of one or more signals generated by other ring oscillators or generated as reference signals. Such instruments may measure or calculate relative delays and/or phase differences between the raw output signal 810 and one or more signals generated by other ring oscillators.

The raw output signal 810 may have a frequency that is measurable by instruments capable of multi-Gigahertz capability. In some instances, process and other parameters may be calculated with sufficient accuracy using a derivative of the raw output signal 810. For example, the raw output signal 810 may be provided to a counter, such as the 8-bit counter 812, which produces a lower frequency (scaled) output signal 814 that may be more easily measured. For example, a raw output signal 810 at 1 GHz and provided to the counter 812 is divided by 32 to produce a scaled output signal 814 at 31.25 MHz.

Figure 9:
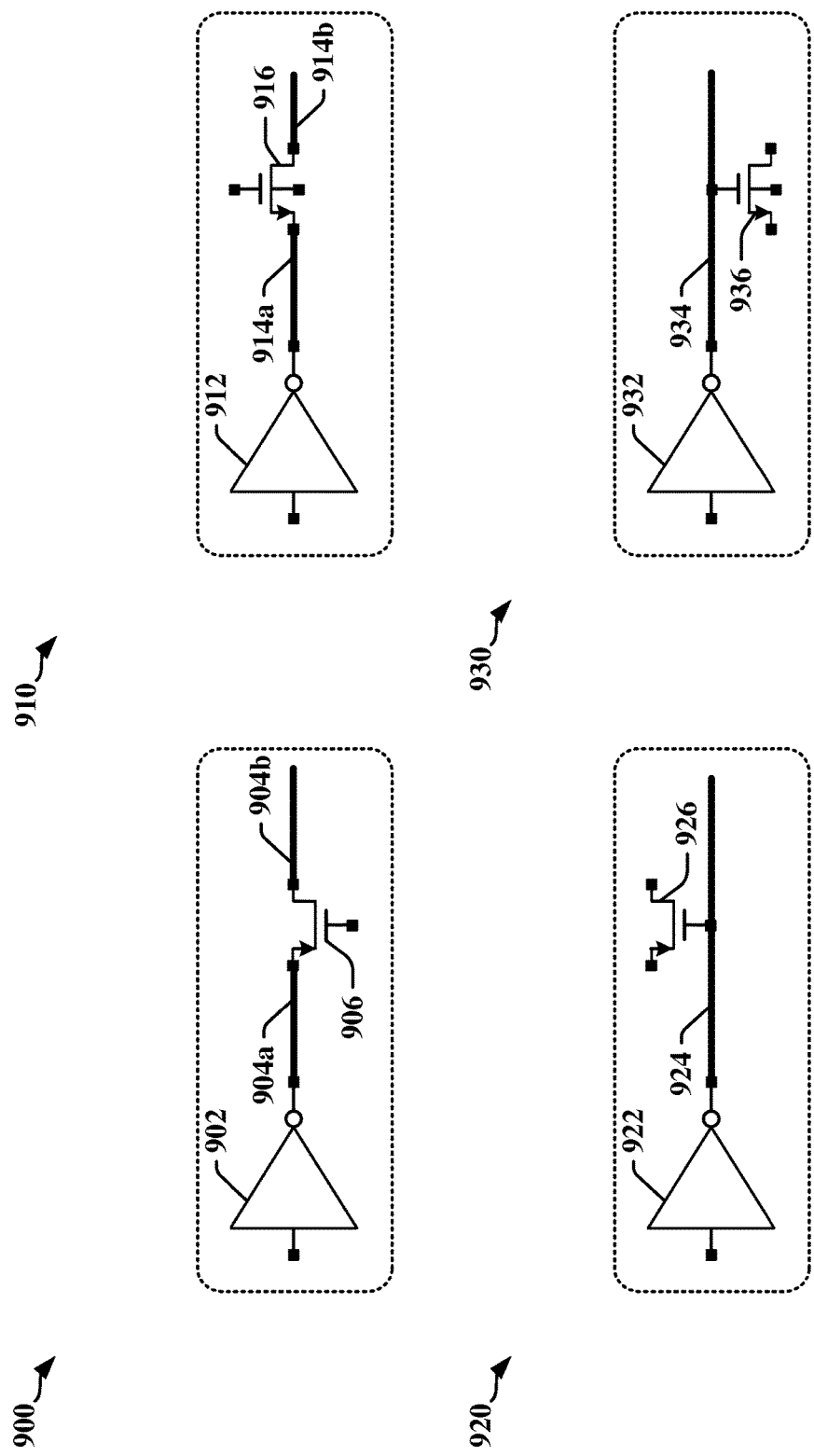
FIG. 9 illustrates a second example of adapted stages of a ring oscillator that may be used to measure certain process variations and to calculate parameters associated with an IC design in accordance with certain aspects disclosed herein.
Figure 10:
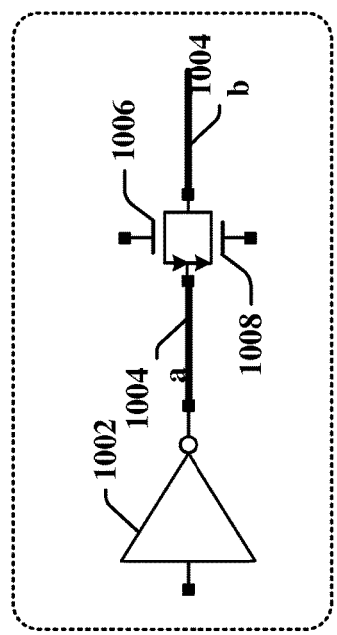
FIG. 10 illustrates a third example of an adapted stage of a ring oscillator that may be used to measure certain process variations and to calculate parameters associated with an IC design in accordance with certain aspects disclosed herein.

FIGS. 9 and 10 illustrate examples of adaptations of the stages 806a-806n of the ring oscillator 802 that may be used to measure certain routing process variations and to calculate parasitic resistance and capacitance values under different process conditions. As described in relation to FIG. 2 above, certain parameters may be derived from the following equations:

$$D = \frac{4nm}{f} \quad \text{Eq. [1a]}$$

$$C_S = \frac{2D(Idda - Iddq)}{Vdd} \quad \text{Eq. [1b]}$$

$$D = R_{SW}C_S \Rightarrow R_{SW} = \frac{V_{dd}}{2D(Idda - Iddq)} \quad \text{Eq. [1c]}$$

and:

$$D1 = R_{sw}(C_{in} + C_{out}) \quad \text{Eq. [2a]}$$

$$D2 = R_{sw}(3C_{in} + C_{out}) \quad \text{Eq. [2b]}$$

$$D3 = R_{sw}(C_{in} + C_{out} + C_L) \quad \text{Eq. [2c]}$$

The stages 806a-806n of the ring oscillator 802 may be adapted to measure other parameters, including parameters associated with a metal-oxide-semiconductor field-effect transistor (MOSFET) such as gate capacitance, source/drain capacitance, and saturation current. Measurements of these parameters obtained from different IC devices can characterize the PVT variation of silicon. In one example, the gate capacitance of an n-channel MOSFET (NMOS) gate or p-channel MOSFET (PMOS) gate can be obtained using ring oscillators that have a single stage adapted to include an NMOS gate or a PMOS gate coupled to an interconnect 904a, 904b, 914a, 914b, 924, 934, as illustrated by the stages 900, 910, 920, and 930 of FIG. 9. Each of the adapted stages 900, 910, 920, 930 includes a logic element (inverter) 902, 912, 922, 932, at least one interconnect 904a, 904b, 914a, 914b, 924, 934 and an MOSFET gate 906, 916, 926, 936. In a first adapted stage 900, a PMOS pass gate configuration is provided. In a second adapted stage 910, an NMOS pass gate configuration is provided. In a third adapted stage 920, a PMOS gate coupled configuration is provided. In a fourth adapted stage 930, an NMOS gate coupled configuration is provided. It will be appreciated that the MOSFETs in FIGS. 9 and 10 may also be implemented using CNFETs.

The delay associated with an NMOS or PMOS gate loaded ring oscillator stage 920, 930 may be calculated as:

$$D4 = R_{sw}(C_{in} + C_{out} + C_{gn}) \quad \text{Eq. [3a]}$$

$$D5 = R_{sw}(C_{in} + C_{out} + C_{gp}) \quad \text{Eq. [3b]}$$

where $C_{gn}$ represents the NMOS gate capacitance and $C_{gp}$ represents the PMOS gate capacitance.

Source and/or drain capacitances may be calculated using the pass gate stages 900, 910. The delay associated with these stages 900, 910 may be calculated as:

$$D6 = R_{sw}(C_{in} + C_{out} + C_{sdp}) \quad \text{Eq. [4a]}$$

$$D7 = R_{sw}(C_{in} + C_{out} + C_{sdn}) \quad \text{Eq. [4b]}$$

where $C_{sdp}$ represents the N-pass gate capacitance, and $C_{sdn}$ represents the P-pass gate capacitance.

The Eq[1c] equation describes the relationship between delay per stage and current. The average stage delay may be separated into charging RC delay and discharging RC delay. Therefore the relation between stage delay and PMOS saturation current and NMOS saturation current can be determined:

$$D = D_{charging} + D_{discharging} = \frac{C_{SVdd}}{2I_{dp}} + \frac{C_{SVdd}}{2I_{dn}} \quad \text{Eq. [5]}$$

where $I_{dp}$ is the PMOS saturation current and $I_{dn}$ is the NMOS saturation current.

Two ring oscillators may be used to calculate PMOS and NMOS saturation currents. One ring oscillator may be configured with stages 200 that include the reference inverters 202, 206, while a second ring oscillator may be configured with low-skew stages 1000. The low-skew stages 1000 illustrate a low-skew inverter that has an inverter 1002, interconnects 1004a, 1004b and an NMOS pass gate 1006 and a PMOS pass gate 1008. The stage capacitance of a low-skew inverter stage 1000 may be calculated as follows:

$$C_{in} = C_{gn} + C_{gp}$$

$$C_{out} = C_{sdp} + C_{sdn}$$

$$C_{sL} = C_{gn} + C_{gp} + C_{sdp} + C_{sdn} + C_w \quad \text{Eq. [6a]}$$

$$C_s = C_{gn} + 2C_{gp} + 2C_{sdp} + C_{sdn} + C_w \quad \text{Eq. [6b]}$$

where $C_w$ the wire capacitance.

Using equations 5 and 6, the saturation current of PMOS and NMOS gates can be calculated as:

$$D8 = (C_{gn} + C_{gp} + C_{sdp} + C_{sdn})Vdd * \left(\frac{1}{2I_{dp}} + \frac{1}{2I_{dn}}\right) \quad \text{Eq. [7a]}$$

$$D9 = (C_{gn} + 2C_{gp} + 2C_{sdp} + C_{sdn})Vdd * \left(\frac{1}{4I_{dp}} + \frac{1}{2I_{dn}}\right) \quad \text{Eq. [7b]}$$

Figure 11:
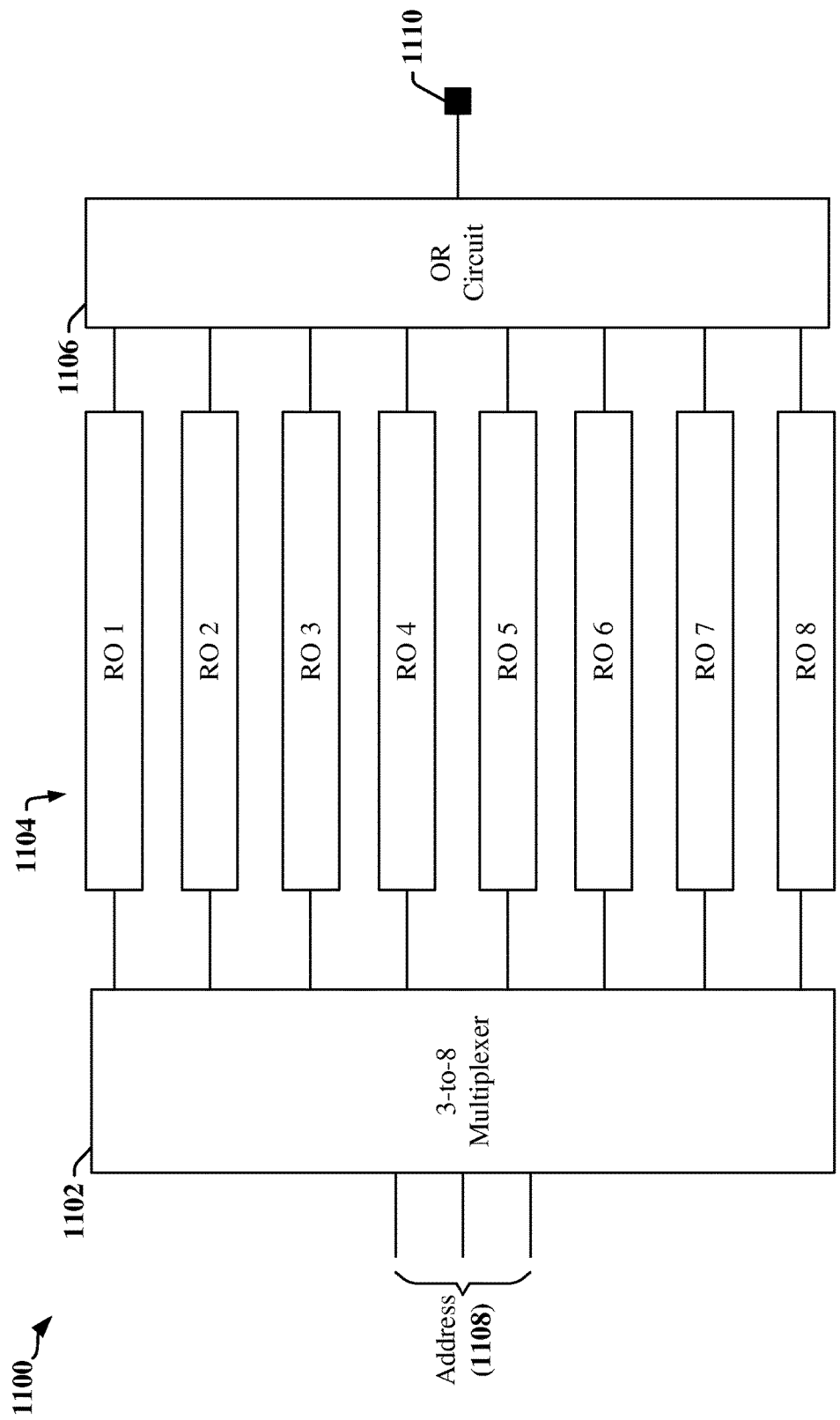
FIG. 11 illustrates an example of a circuit that may be used to control the operation of multiple ring oscillators in accordance with certain aspects disclosed herein.

FIG. 11 is a block schematic diagram illustrating an example of a circuit 1100 that may be used to control the operation of multiple ring oscillators 1104 that have been configured with different stages in order to provide sufficient information to solve various equations, including those described herein. A multiplexer 1102 may be used to selectively enable one of a plurality of ring oscillators 1104 to provide an output signal. A processing circuit or other circuit may provide an address that is decoded by the multiplexer 1102 to select one of the ring oscillators 1104 for enabling. The outputs of the unselected ring oscillators 1104 may be at a predetermined logic level (here, logic low) such that the circuit 1100 can produce an output 1110 using simple combinational logic, here an OR circuit 1106.

Examples of Processing Circuits and Methods

Figure 12:
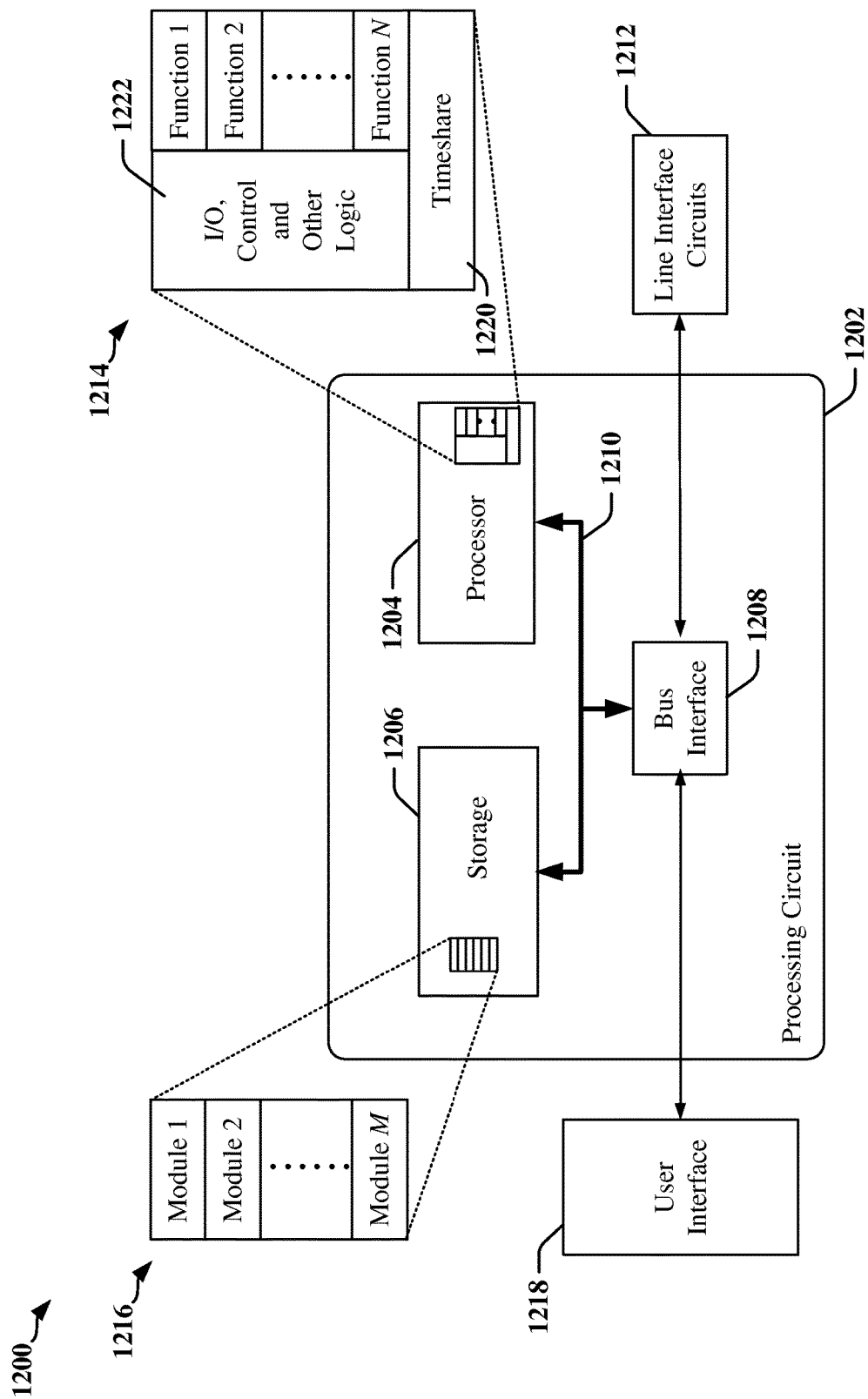
FIG. 12 is a block diagram illustrating an example of an apparatus employing a processing circuit that may be adapted according to certain aspects disclosed herein.

FIG. 12 is a conceptual diagram 1200 illustrating a simplified example of a hardware implementation for an apparatus employing a processing circuit 1202 that may be configured to perform one or more functions disclosed herein. In accordance with various aspects of the disclosure, an element, or any portion of an element, or any combination of elements as disclosed herein may be implemented using the processing circuit 1202. The processing circuit 1202 may include one or more processors 1204 that are controlled by some combination of hardware and software modules. Examples of processors 1204 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 1204 may include specialized processors that perform specific functions, and that may be configured, augmented or controlled by one of the software modules 1216. The one or more processors 1204 may be configured through a combination of software modules 1216 loaded during initialization, and further configured by loading or unloading one or more software modules 1216 during operation.

In the illustrated example, the processing circuit 1202 may be implemented with a bus architecture, represented generally by the bus 1210. The bus 1210 may include any number of interconnecting buses and bridges depending on the specific application of the processing circuit 1202 and the overall design constraints. The bus 1210 links together various circuits including the one or more processors 1204, and storage 1206. Storage 1206 may include memory devices and mass storage devices, and may be referred to herein as computer-readable media and/or processor-readable media. The bus 1210 may also link various other circuits such as timing sources, timers, peripherals, voltage regulators, and power management circuits. A bus interface 1208 may provide an interface between the bus 1210 and one or more transceivers 1212. A transceiver 1212 may be provided for each networking technology supported by the processing circuit. In some instances, multiple networking technologies may share some or all of the circuitry or processing modules found in a transceiver 1212. Each transceiver 1212 provides a means for communicating with various other apparatus over a transmission medium. Depending upon the nature of the apparatus, a user interface 1218 (e.g., keypad, display, speaker, microphone, joystick) may also be provided, and may be communicatively coupled to the bus 1210 directly or through the bus interface 1208.

A processor 1204 may be responsible for managing the bus 1210 and for general processing that may include the execution of software stored in a computer-readable medium that may include the storage 1206. In this respect, the processing circuit 1202, including the processor 1204, may be used to implement any of the methods, functions and techniques disclosed herein. The storage 1206 may be used for storing data that is manipulated by the processor 1204 when executing software, and the software may be configured to implement any one of the methods disclosed herein.

One or more processors 1204 in the processing circuit 1202 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1206 or in an external computer readable medium. The external computer-readable medium and/or storage 1206 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 1206 may also include, by way of example, a carrier wave, a transmission line, and any other suitable medium for transmitting software and/or instructions that may be accessed and read by a computer. Computer-readable medium and/or the storage 1206 may reside in the processing circuit 1202, in the processor 1204, external to the processing circuit 1202, or be distributed across multiple entities including the processing circuit 1202. The computer-readable medium and/or storage 1206 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1206 may maintain software maintained and/or organized in loadable code segments, modules, applications, programs, etc., which may be referred to herein as software modules 1216. Each of the software modules 1216 may include instructions and data that, when installed or loaded on the processing circuit 1202 and executed by the one or more processors 1204, contribute to a run-time image 1214 that controls the operation of the one or more processors 1204. When executed, certain instructions may cause the processing circuit 1202 to perform functions in accordance with certain methods, algorithms and processes described herein.

Some of the software modules 1216 may be loaded during initialization of the processing circuit 1202, and these software modules 1216 may configure the processing circuit 1202 to enable performance of the various functions disclosed herein. For example, some software modules 1216 may configure internal devices and/or logic circuits 1222 of the processor 1204, and may manage access to external devices such as the transceiver 1212, the bus interface 1208, the user interface 1218, timers, mathematical coprocessors, and so on. The software modules 1216 may include a control program and/or an operating system that interacts with interrupt handlers and device drivers, and that controls access to various resources provided by the processing circuit 1202. The resources may include memory, processing time, access to the transceiver 1212, the user interface 1218, and so on.

One or more processors 1204 of the processing circuit 1202 may be multifunctional, whereby some of the software modules 1216 are loaded and configured to perform different functions or different instances of the same function. The one or more processors 1204 may additionally be adapted to manage background tasks initiated in response to inputs from the user interface 1218, the transceiver 1212, and device drivers, for example. To support the performance of multiple functions, the one or more processors 1204 may be configured to provide a multitasking environment, whereby each of a plurality of functions is implemented as a set of tasks serviced by the one or more processors 1204 as needed or desired. In one example, the multitasking environment may be implemented using a timesharing program 1220 that passes control of a processor 1204 between different tasks, whereby each task returns control of the one or more processors 1204 to the timesharing program 1220 upon completion of any outstanding operations and/or in response to an input such as an interrupt. When a task has control of the one or more processors 1204, the processing circuit is effectively specialized for the purposes addressed by the function associated with the controlling task. The timesharing program 1220 may include an operating system, a main loop that transfers control on a round-robin basis, a function that allocates control of the one or more processors 1204 in accordance with a prioritization of the functions, and/or an interrupt driven main loop that responds to external events by providing control of the one or more processors 1204 to a handling function.

Figure 13:
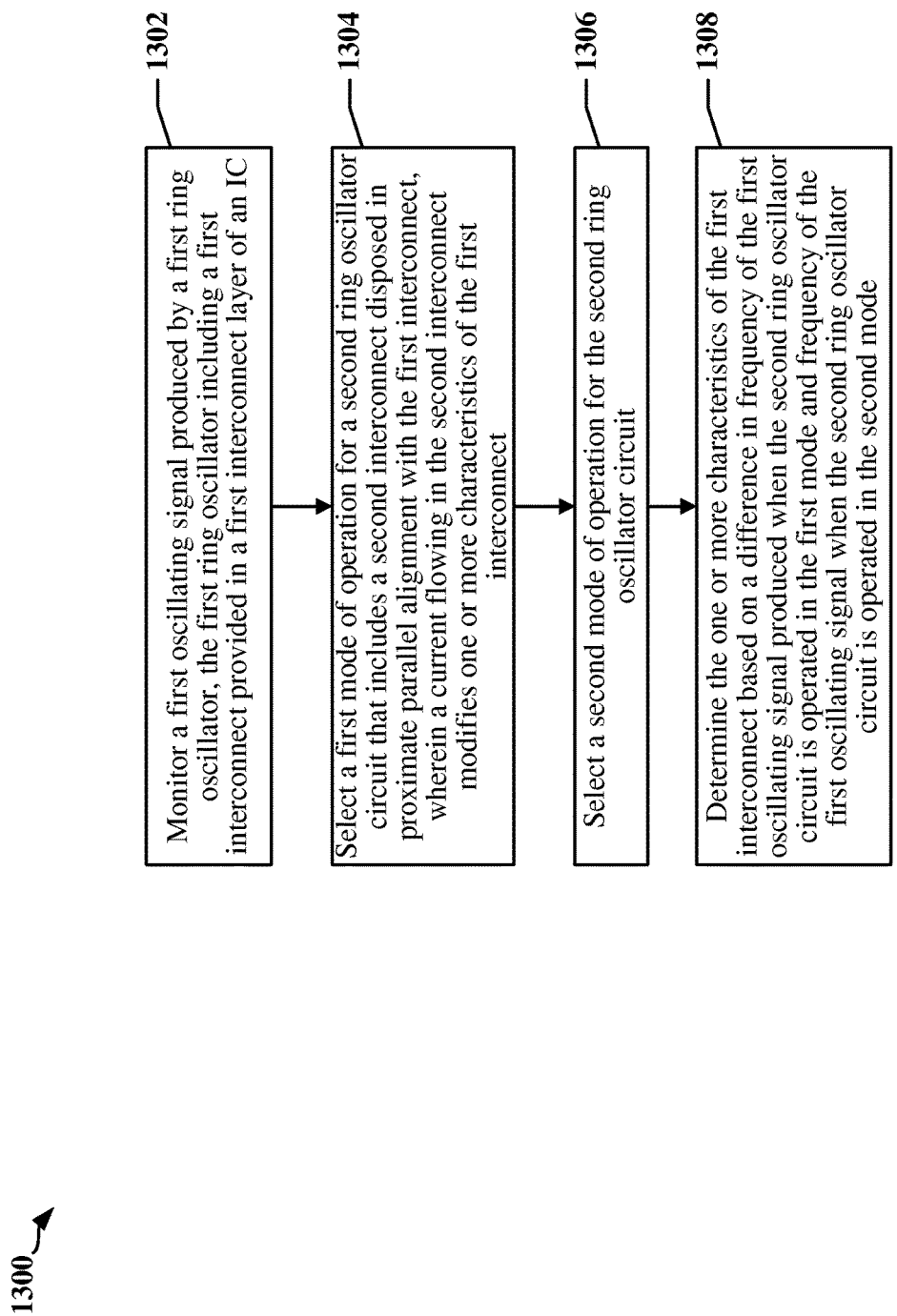
FIG. 13 is a flow chart of a first method that may be performed by a processing circuit in accordance with certain aspects disclosed herein.

FIG. 13 is a flow chart 1300 of a method according to certain aspects disclosed herein. The method may be employed to manage and monitor the operation of a plurality of aggressor circuits that may be operated to obtain measurements of frequency of a signal produced victim ring oscillator under different conditions, which may correspond to different operational modes of the aggressor circuits. In one example, the victim ring oscillator and ring oscillators in the aggressor circuits may have with multiple delay stages that each include two inverting logic elements coupled by an interconnect. The victim ring oscillator and aggressor circuits my use the same or different interconnect layers to calculate power and delay characteristics. In one example, a set of aggressor circuits may include interconnects in the same layer as interconnects of the victim ring oscillator, and aligned along side corresponding interconnects in the victim ring oscillator. In another example, a set of aggressor circuits may include interconnects in one or more layers that are different from the layer that carries interconnects of the victim ring oscillator (e.g., above or below the layer that carries interconnects of the victim ring oscillator). In some instances, the aggressor circuits may include a simple metal interconnect without intervening logic elements.

In one example, the method commences at block 1302, where a frequency of a first oscillating signal produced by a first ring oscillator is monitored. The first ring oscillator may include a first delay stage that includes inverting logic elements coupled by a first interconnect of a first interconnect layer in an IC.

At block 1304, a first mode of operation for a second ring oscillator circuit may be selected. The second ring oscillator circuit may have a second delay stage that includes inverting logic elements coupled by a second interconnect in the IC. The second interconnect may be disposed in proximate alignment with the first interconnect. A current flowing in the second interconnect may modify one or more characteristics of the first interconnect.

At block 1306, a second mode of operation for the second ring oscillator circuit may be selected.

At block 1308, the one or more characteristics of the first interconnect may be determined based on a difference in frequency of the first oscillating signal when the second ring oscillator circuit is operated in the first mode and frequency of the first oscillating signal when the second ring oscillator circuit is operated in the second mode.

In one example, the current provided in the second interconnect is a non-oscillating current when the second ring oscillator circuit is operated in the first mode. In this example, a fixed-state (non-oscillating) signal may be provided to the input of the second ring oscillator circuit. The second interconnect may shield the first interconnect from extraneous interference when the second ring oscillator circuit is operated in the first mode.

In another example, the current provided in the second interconnect corresponds to an oscillating signal produced by the second ring oscillator circuit when the second ring oscillator circuit is operated in the second mode. The second oscillating signal may be electromagnetically or capacitively coupled to the first interconnect when the second ring oscillator circuit is operated in the second mode.

In another example, the current provided in the second interconnect corresponds to an in-phase version of the first oscillating signal when the second ring oscillator circuit is operated in the second mode. The second oscillating signal may be electromagnetically or capacitively coupled to the first interconnect when the second ring oscillator circuit is operated in the second mode.

In another example, the current provided in the second interconnect corresponds to an out-of-phase version of the first oscillating signal when the second ring oscillator circuit is operated in the second mode. The second oscillating signal may be electromagnetically or capacitively coupled to the first interconnect when the second ring oscillator circuit is operated in the second mode.

In some instances, the second interconnect is provided in the first interconnect layer in parallel to the first interconnect. In some instances, the second interconnect is provided in a second interconnect layer that is in planar alignment with the first interconnect layer. The second interconnect may be in parallel alignment with the first interconnect.

In some examples, the second ring oscillator circuit is one of a plurality of aggressor ring oscillator circuits. Each aggressor ring oscillator circuit may include a plurality of serially connected inverters, and an aggressor interconnect disposed in proximate parallel alignment with the first interconnect. Selecting the first mode of operation or the second mode of operation may include selecting between a signal corresponding to an output of the plurality of serially connected inverters, one or more phase versions of the first oscillating signal, and a fixed-state signal as an input to the plurality of serially connected inverters. The aggressor interconnect may be provided in the first interconnect layer or in a second interconnect layer that is in planar alignment with the first interconnect layer.

Figure 14:
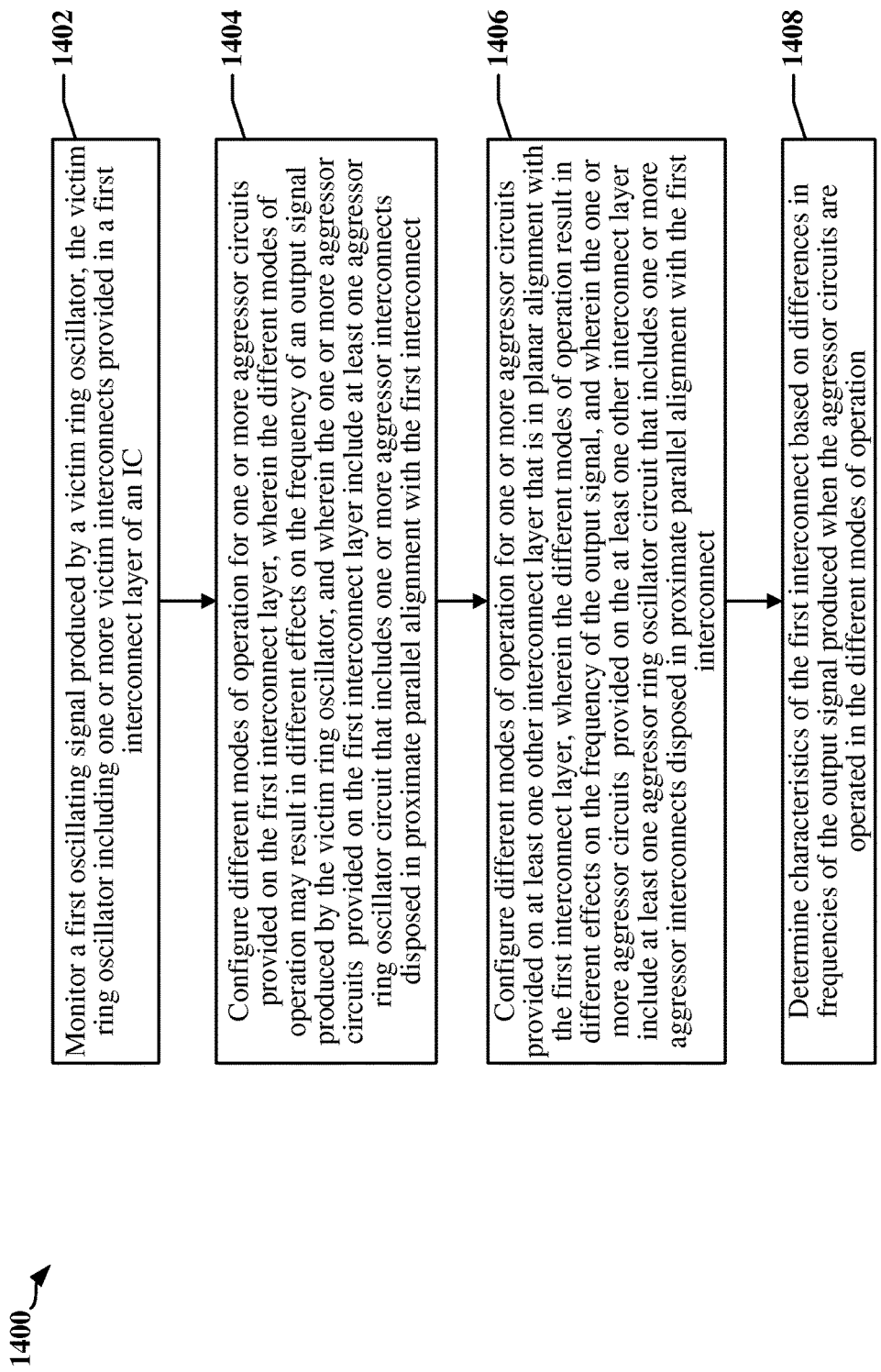
FIG. 14 is a flow chart of a second method that may be performed by a processing circuit in accordance with certain aspects disclosed herein.

FIG. 14 is a flow chart 1400 of a method according to certain aspects disclosed herein. The method may be employed to manage and monitor the operation of a plurality of aggressor circuits that may be operated to obtain measurements of frequency of a signal produced victim ring oscillator under different conditions, which may correspond to different operational modes of the aggressor circuits. In one example, the victim ring oscillator and ring oscillators in the aggressor circuits may have with multiple delay stages that each include two inverting logic elements coupled by an interconnect. The victim ring oscillator and aggressor circuits my use the same or different interconnect layers to calculate power and delay characteristics. In one example, a set of aggressor circuits may include interconnects in the same layer as interconnects of the victim ring oscillator, and aligned along side corresponding interconnects in the victim ring oscillator. In another example, a set of aggressor circuits may include interconnects in one or more layers that are different from the layer that carries interconnects of the victim ring oscillator (e.g., above or below the layer that carries interconnects of the victim ring oscillator). In some instances, the aggressor circuits may include a simple metal interconnect without intervening logic elements.

In one example, the method commences at block 1402, where a first oscillating signal produced by a victim ring oscillator is monitored. The victim ring oscillator may include one or more victim interconnects provided in a first interconnect layer of an IC.

At block 1404, different modes of operation for one or more aggressor circuits provided on the first interconnect layer may be configured. The different modes of operation may result different effects on the frequency of an output signal produced by the victim ring oscillator. The one or more aggressor circuits provided on the first interconnect layer may include at least one aggressor ring oscillator circuit that includes one or more aggressor interconnects disposed in proximate parallel alignment with the first interconnect.

At block 1406, different modes of operation for one or more other aggressor circuits provided on at least one other interconnect layer that is in planar alignment with the first interconnect layer. The different modes of operation may result in different effects on the frequency of the output signal. The one or more aggressor circuits provided on the at least one other interconnect layer may include at least one aggressor ring oscillator circuit that includes one or more aggressor interconnects disposed in proximate parallel alignment with the first interconnect.

At block 1408, characteristics of the first interconnect may be determined based on differences in frequencies of the output signal produced when the aggressor circuits are operated in the different modes of operation. In one example, the differences in frequencies, and/or the values of the different frequencies may be used to derive certain parameters using equations provided herein, including one or more of the equations 1a, 1b, 1c, 2a, 2b, 2c, 3a, 3b, 4a, 4b, 5, 6a, 6b, 7a, and/or 7b discussed in relation to FIGS. 9 and 10.

Figure 15:
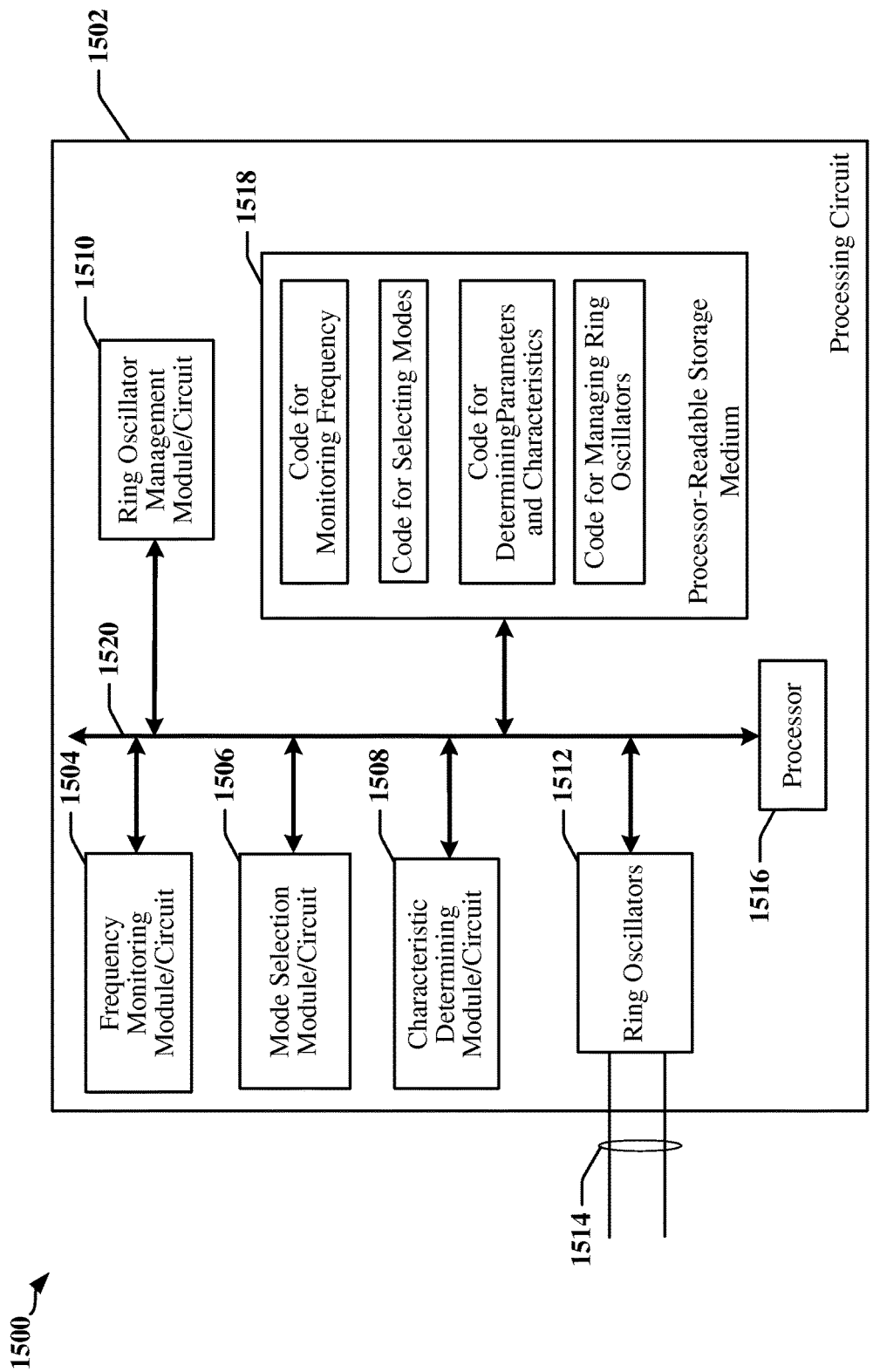
FIG. 15 is a diagram illustrating an example of a hardware implementation for an apparatus according to one or more aspects disclosed herein.

FIG. 15 is a diagram illustrating a simplified example of a hardware implementation for an apparatus 1500 employing a processing circuit 1502. The processing circuit typically has a processor 1516 that may include one or more of a microprocessor, microcontroller, digital signal processor, a sequencer and a state machine. The processing circuit 1502 may be implemented with a bus architecture, represented generally by the bus 1520. The bus 1520 may include any number of interconnecting buses and bridges depending on the specific application of the processing circuit 1502 and the overall design constraints. The bus 1520 links together various circuits including one or more processors and/or hardware modules, represented by the processor 1516, the modules or circuits 1504, 1506, 1508, and 1510, ring oscillators 1512 that may include interconnects 1514, and the computer-readable storage medium 1518. The bus 1520 may also link various other circuits such as timing sources, peripherals, voltage regulators, and power management circuits, which are well known in the art, and therefore, will not be described any further.

The processor 1516 is responsible for general processing, including the execution of software stored on the computer-readable storage medium 4218. The software, when executed by the processor 1516, causes the processing circuit 1502 to perform the various functions described supra for any particular apparatus. The computer-readable storage medium 1518 may also be used for storing data that is manipulated by the processor 1516 when executing software, including data decoded from symbols transmitted over the interconnects 1514. The processing circuit 1502 further includes at least one of the modules 1504, 1506, 1508, and 1510. The modules 1504, 1506, 1508, and 1510 may be software modules running in the processor 1516, resident/stored in the computer-readable storage medium 1518, one or more hardware modules coupled to the processor 1516, or some combination thereof. The modules 1504, 1506, 1508, and/or 1510 may include microcontroller instructions, state machine configuration parameters, or some combination thereof.

In one configuration, the apparatus 1500 for wireless communication includes modules and/or circuits 1504 for monitoring a frequency of operation of one or more of the ring oscillators 1512, modules and/or circuits 1506 for selecting modes of operation of ring oscillators 1512, modules and/or circuits 1508 for calculating, or otherwise determining characteristics of an interconnect layer, modules and/or circuits 1510 for configuring, managing and/or controlling the ring oscillators 1512.

In one example, the apparatus may include means 1512, 1516, 1504 for monitoring a first oscillating signal produced by a first ring oscillator, the first ring oscillator including a first interconnect provided in a first interconnect layer of an IC. The apparatus may include means 1512, 1516, 1506 for selecting first and second modes of operation for a second ring oscillator circuit that includes a second interconnect disposed in proximate parallel alignment with the first interconnect, where a current flowing in the second interconnect modifies one or more characteristics of the first interconnect. The apparatus may include means 1512, 1516, 1510 for determining the one or more characteristics of the first interconnect based on a difference in frequency of the first oscillating signal produced when the second ring oscillator circuit is operated in the first mode and frequency of the first oscillating signal when the second ring oscillator circuit is operated in the second mode. Differences between the frequency of the signal produced by the first ring oscillator while the second ring oscillator is operated in the different modes may be indicative of one or more parameters associated with a semiconductor manufacturing process.

In another example, the processing circuit 1502 may execute instructions maintained in the computer-readable storage medium 1518, whereby such execution causes the apparatus 1500 to monitor or measure a first oscillating signal produced by a first ring oscillator, the first ring oscillator including a first interconnect provided in a first interconnect layer of an IC, select a first mode of operation for a second ring oscillator circuit that includes a second interconnect disposed in proximate parallel alignment with the first interconnect, where a current flowing in the second interconnect modifies one or more characteristics of the first interconnect, select a second mode of operation for the second ring oscillator circuit, and determine the one or more characteristics of the first interconnect based on a difference in frequency of the first oscillating signal produced when the second ring oscillator circuit is operated in the first mode and frequency of the first oscillating signal when the second ring oscillator circuit is operated in the second mode.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
    a first ring oscillator circuit comprising a first delay stage that includes inverting logic elements coupled by a first interconnect of a first interconnect layer in an integrated circuit (IC);
    a second ring oscillator circuit comprising a second delay stage that includes inverting logic elements coupled by a second interconnect in the IC, wherein the second interconnect is disposed in proximate alignment with the first interconnect;
    a processing circuit configured to:
        enable the first ring oscillator circuit, wherein the first ring oscillator circuit produces a first oscillating signal when enabled where the first oscillating signal has a frequency indicative of one or more characteristics of the first interconnect, and
        monitor frequency of the first oscillating signal while operating the second ring oscillator circuit in a first mode of operation;
        monitor frequency of the first oscillating signal while operating the second ring oscillator circuit in a second mode of operation; and
        determine one or more characteristics of the first interconnect based on a difference in frequency of the first oscillating signal when the second ring oscillator circuit is operated in the first mode of operation and frequency of the first oscillating signal when the second ring oscillator circuit is operated in the second mode of operation; and
    a multiplexer that receives a feedback signal corresponding to an output of the second ring oscillator circuit and one or more phase versions of the first oscillating signal, wherein a control signal selects an output of the multiplexer from the feedback signal, the one or more phase versions of the first oscillating signal and one or more fixed-state signals,
    wherein a current corresponding to the output of the multiplexer and provided in the second interconnect modifies the one or more characteristics of the first interconnect.

2. The apparatus of claim 1, wherein the current provided in the second interconnect is a non-oscillating current, and wherein the second interconnect shields the first interconnect from extraneous interference.

3. The apparatus of claim 1, wherein the current provided in the second interconnect corresponds to a second oscillating signal that is produced by the second ring oscillator circuit, and wherein the second oscillating signal is electromagnetically or capacitively coupled to the first interconnect.

4. The apparatus of claim 1, wherein the current provided in the second interconnect corresponds to a second oscillating signal that is an in-phase version of the first oscillating signal, and wherein the second oscillating signal is electromagnetically or capacitively coupled to the first interconnect.

5. The apparatus of claim 1, wherein the current provided in the second interconnect corresponds to a second oscillating signal that is an out-of-phase version of the first oscillating signal, and wherein the second oscillating signal is electromagnetically or capacitively coupled to the first interconnect.

6. The apparatus of claim 1, wherein the second interconnect is provided in the first interconnect layer in parallel alignment with the first interconnect.

7. The apparatus of claim 1, wherein the second interconnect is provided in a second interconnect layer that is in planar alignment with the first interconnect layer, and wherein the second interconnect is in parallel alignment with the first interconnect.

8. The apparatus of claim 1, wherein the second ring oscillator circuit is one of a plurality of aggressor ring oscillator circuits, wherein each aggressor ring oscillator circuit comprises:
    an aggressor interconnect disposed in proximate parallel alignment with the first interconnect; and
    a multiplexer that receives a feedback signal corresponding to an output of the each ring oscillator circuit and one or more phase versions of the first oscillating signal,
    wherein a control signal selects an output of the multiplexer from the feedback signal, the one or more phase versions of the first oscillating signal, and one or more fixed-state signals, and
    wherein the current provided in the aggressor interconnect corresponds to the output of the multiplexer.

9. The apparatus of claim 8, wherein aggressor interconnects are provided in the first interconnect layer and in at least one other interconnect layer that is in planar alignment with the first interconnect layer.

10. The apparatus of claim 8, wherein a first aggressor interconnect is provided in a first adjacent layer and a second aggressor interconnect is provided in a second adjacent layer, where the first interconnect layer is disposed between the first adjacent layer and the second adjacent layer.

11. The apparatus of claim 8, wherein process parameters associated with manufacture of the IC are determinable using frequency measurements of the first oscillating signal under different operational configurations.

12. A method comprising:
monitoring a frequency of a first oscillating signal produced by a first ring oscillator, the first ring oscillator comprising a first delay stage that includes inverting logic elements coupled by a first interconnect of a first interconnect layer in an integrated circuit (IC);
selecting a first mode of operation for a second ring oscillator circuit that comprises a second delay stage that includes inverting logic elements coupled by a second interconnect in the IC, wherein the second interconnect is disposed in proximate alignment with the first interconnect, and wherein a current flowing in the second interconnect modifies one or more characteristics of the first interconnect;
selecting a second mode of operation for the second ring oscillator circuit; and
determining the one or more characteristics of the first interconnect based on a difference in frequency of the first oscillating signal when the second ring oscillator circuit is operated in the first mode and frequency of the first oscillating signal when the second ring oscillator circuit is operated in the second mode,
wherein the second ring oscillator circuit is one of a plurality of aggressor ring oscillator circuits, wherein each aggressor ring oscillator circuit comprises:
a plurality of serially connected inverters; and
an aggressor interconnect disposed in proximate parallel alignment with the first interconnect, and
wherein selecting the first mode of operation or the second mode of operation includes:
selecting between a signal corresponding to an output of the plurality of serially connected inverters, one or more phase versions of the first oscillating signal, and a fixed-state signal as an input to the plurality of serially connected inverters.

13. The method of claim 12, wherein the current provided in the second interconnect is a non-oscillating current when the second ring oscillator circuit is operated in the first mode, and wherein the second interconnect shields the first interconnect from extraneous interference when the second ring oscillator circuit is operated in the first mode.

14. The method of claim 13, wherein the current provided in the second interconnect corresponds to a second oscillating signal that is produced by the second ring oscillator circuit when the second ring oscillator circuit is operated in the second mode, and wherein the second oscillating signal is electromagnetically or capacitively coupled to the first interconnect when the second ring oscillator circuit is operated in the second mode.

15. The method of claim 13, wherein the current provided in the second interconnect corresponds to a second oscillating signal that is an in-phase version of the first oscillating signal when the second ring oscillator circuit is operated in the second mode, and wherein the second oscillating signal is electromagnetically or capacitively coupled to the first interconnect when the second ring oscillator circuit is operated in the second mode.

16. The method of claim 13, wherein the current provided in the second interconnect corresponds to a second oscillating signal that is an out-of-phase version of the first oscillating signal when the second ring oscillator circuit is operated in the second mode, and wherein the second oscillating signal is electromagnetically or capacitively coupled to the first interconnect when the second ring oscillator circuit is operated in the second mode.

17. The method of claim 12, wherein the second interconnect is provided in the first interconnect layer in parallel to the first interconnect.

18. The method of claim 12, wherein the second interconnect is provided in a second interconnect layer that is in planar alignment with the first interconnect layer, and wherein the second interconnect is in parallel alignment with the first interconnect.

19. The method of claim 12, wherein aggressor interconnects are provided in the first interconnect layer and in at least one other interconnect layer that is in planar alignment with the first interconnect layer.

20. The method of claim 12, further comprising:
obtaining a plurality of measurements of frequency of the first oscillating signal, each measurement of frequency corresponding to a different operational configuration of the plurality of aggressor ring oscillator circuits; and
correlating differences in the plurality of measurements of frequency with values of one or more parameters corresponding to a manufacturing process used to produce the IC.

21. An apparatus comprising:
a plurality of ring oscillators including:
a victim ring oscillator, the victim ring oscillator comprising a plurality of delay stages, each stage including inverting logic elements coupled by an interconnect in a first interconnect layer in an integrated circuit (IC); and
a plurality of aggressor circuits, including one or more aggressor ring oscillators, where each aggressor ring oscillator comprises:
a plurality of delay stages, each stage including inverting logic elements coupled by an aggressor interconnect in the IC, wherein each aggressor interconnect is disposed in proximate alignment with a corresponding victim interconnect, and wherein a current flowing in the each aggressor interconnect modifies one or more characteristics of the corresponding victim interconnect; and
a multiplexer that receives a feedback signal corresponding to an output of the each aggressor ring oscillator circuit and one or more phase versions of a signal produced by the victim ring oscillator,
wherein a control signal selects an output of the multiplexer in accordance with a selected mode of operation, the output of the multiplexer being selected from the feedback signal, the one or more phase versions of the signal produced by the victim ring oscillator, and one or more fixed-state signals, and
wherein the current provided in an aggressor interconnect coupled to the each aggressor ring oscillator corresponds to the output of the multiplexer;
mode selection logic that configures a mode of operation of the one or more aggressor ring oscillators; and
a processing circuit configured to:
control the mode selection logic to configure different modes of operation for the one or more aggressor ring oscillators; and
measure a frequency of the signal produced by the victim ring oscillator when the one or more aggressor ring oscillators is operated in each of the different modes of operation,
wherein one or more one or more parameters corresponding to a manufacturing process used to produce the IC are calculable based on differences in frequency of the signal produced by the victim ring oscillator measured when the plurality of ring oscillators is operated in different modes of operation.

22. The apparatus of claim 21, wherein aggressor interconnects are provided in the first interconnect layer and in at least one other interconnect layer that is in planar alignment with the first interconnect layer.

23. The apparatus of claim 21, wherein the plurality of aggressor circuits includes a metal interconnect disposed in proximate alignment with one or more victim interconnects, where the metal interconnect carries a current that is inductively or capacitively coupled to the one or more victim interconnects.

24. The apparatus of claim 21, wherein the current provided in one or more aggressor interconnects is a non-oscillating current when the plurality of ring oscillators is operated in a first mode of operation.

25. The apparatus of claim 21, wherein the current provided in an aggressor interconnect of at least one aggressor ring oscillator corresponds to a signal produced by the at least one aggressor ring oscillator when the plurality of ring oscillators is operated in a second mode of operation.

26. The apparatus of claim 21, wherein the current provided in an aggressor interconnect of at least one aggressor ring oscillator corresponds to an in-phase version of the signal produced by the victim ring oscillator when the plurality of ring oscillators is operated in a third mode of operation.

27. A non-transitory processor-readable storage medium having instructions stored thereon, wherein the instructions when executed by a processor, cause the processor to:
monitor a frequency of a first oscillating signal produced by a first ring oscillator, the first ring oscillator comprising a first delay stage that includes inverting logic elements coupled by a first interconnect of a first interconnect layer in an integrated circuit (IC);
select a first mode of operation for a second ring oscillator circuit that comprises a second delay stage that includes inverting logic elements coupled by a second interconnect in the IC, wherein the second interconnect is disposed in proximate alignment with the first interconnect, and wherein a current flowing in the second interconnect modifies one or more characteristics of the first interconnect;
select a second mode of operation for the second ring oscillator circuit; and
determine the one or more characteristics of the first interconnect based on a difference in frequencies produced by the first oscillating signal when the second ring oscillator circuit is operated in the first mode and a frequency of the first oscillating signal when the second ring oscillator circuit is operated in the second mode,
wherein the second ring oscillator circuit is one of a plurality of aggressor ring oscillator circuits, wherein each aggressor ring oscillator circuit comprises:
a plurality of serially connected inverters; and
an aggressor interconnect disposed in proximate parallel alignment with the first interconnect, and
wherein selecting the first mode of operation or the second mode of operation includes:
selecting between a signal corresponding to an output of the plurality of serially connected inverters, one or more phase versions of the first oscillating signal, and a fixed-state signal as an input to the plurality of serially connected inverters.

* * * * *